(12) United States Patent
Beall et al.

(10) Patent No.: US 11,186,517 B2
(45) Date of Patent: Nov. 30, 2021

(54) CHEMICALLY STRENGTHENABLE LITHIUM ALUMINOSILICATE GLASSES WITH INHERENT DAMAGE RESISTANCE

(71) Applicant: CORNING INCORPORATED, Corning, NY (US)

(72) Inventors: George Halsey Beall, Big Flats, NY (US); Matthew John Dejneka, Corning, NY (US); Qiang Fu, Painted Post, NY (US); Sinue Gomez, Corning, NY (US); Robert Michael Morena, Lindley, NY (US); Charlene Marie Smith, Corning, NY (US)

(73) Assignee: CORNING INCORPORATED, Corning, NY (US)

( * ) Notice: Subject to any disclaimer, the term of this patent is extended or adjusted under 35 U.S.C. 154(b) by 262 days.

(21) Appl. No.: 16/193,266

(22) Filed: Nov. 16, 2018

(65) Prior Publication Data
US 2019/0084870 A1 Mar. 21, 2019

Related U.S. Application Data

(62) Division of application No. 15/400,267, filed on Jan. 6, 2017, now Pat. No. 10,131,567.

(60) Provisional application No. 62/276,431, filed on Jan. 8, 2016.

(51) Int. Cl.
| | |
|---|---|
| *C03C 3/097* | (2006.01) |
| *C03C 3/091* | (2006.01) |
| *C03C 21/00* | (2006.01) |
| *C03C 3/093* | (2006.01) |
| *C03C 4/18* | (2006.01) |
| *B32B 17/06* | (2006.01) |
| *H05K 5/00* | (2006.01) |
| *H05K 5/03* | (2006.01) |
| *C03C 3/087* | (2006.01) |

(52) U.S. Cl.
CPC .............. *C03C 3/097* (2013.01); *B32B 17/06* (2013.01); *C03C 3/087* (2013.01); *C03C 3/091* (2013.01); *C03C 3/093* (2013.01); *C03C 4/18* (2013.01); *C03C 21/002* (2013.01); *H05K 5/0017* (2013.01); *H05K 5/03* (2013.01); *B32B 2307/50* (2013.01); *C03C 2204/00* (2013.01)

(58) Field of Classification Search
CPC ......... C03C 3/091; C03C 3/093; C03C 3/087; C03C 3/097; C03C 21/00; C03C 21/002
See application file for complete search history.

(56) References Cited

U.S. PATENT DOCUMENTS

| | | | |
|---|---|---|---|
| 3,433,611 A | 3/1969 | Saunders et al. | |
| 3,615,320 A | 10/1971 | Junge et al. | |
| 3,790,260 A | 2/1974 | Boyd et al. | |
| 4,038,090 A | 7/1977 | Gliemeroth | |
| 4,156,755 A | 5/1979 | Rinehart | |
| 5,674,790 A | 10/1997 | Araujo | |
| 9,199,876 B2 | 12/2015 | Wang et al. | |
| 9,446,982 B2 | 9/2016 | Siebers et al. | |
| 10,131,567 B2 * | 11/2018 | Beall | B32B 17/06 |
| 2009/0142568 A1 | 6/2009 | Dejneka et al. | |
| 2009/0298669 A1 | 12/2009 | Akiba et al. | |
| 2010/0047521 A1 | 2/2010 | Amin et al. | |
| 2011/0014475 A1 | 1/2011 | Murata | |
| 2011/0079048 A1 | 4/2011 | Shelestak et al. | |
| 2011/0294649 A1 | 12/2011 | Gomez et al. | |
| 2012/0015150 A1 | 1/2012 | Suzuki | |
| 2012/0052271 A1 | 3/2012 | Gomez et al. | |
| 2012/0321898 A1 | 12/2012 | Meinhardt et al. | |
| 2013/0183512 A1 | 7/2013 | Gy et al. | |
| 2013/0189486 A1 | 7/2013 | Wang et al. | |
| 2014/0090470 A1 | 4/2014 | Fujimoto et al. | |
| 2014/0170380 A1 | 6/2014 | Murata et al. | |
| 2015/0030840 A1 | 1/2015 | Gomez et al. | |
| 2015/0099124 A1 | 4/2015 | Beunet et al. | |
| 2015/0152003 A1 | 6/2015 | Kawamoto et al. | |
| 2015/0166402 A1 | 6/2015 | Muguruma et al. | |
| 2015/0376054 A1 | 12/2015 | Beall et al. | |
| 2016/0347655 A1 | 12/2016 | Meinhardt et al. | |

(Continued)

FOREIGN PATENT DOCUMENTS

| | | |
|---|---|---|
| CN | 1886348 A | 12/2006 |
| CN | 102040334 A | 5/2011 |
| CN | 103003210 A | 3/2013 |

(Continued)

OTHER PUBLICATIONS

"Standard Test Method for Annealing Point and Strain Point of Glass by Beam Bending", ASTM Designation: C598-93 (Reapproved 2013), 5 pgs.
"Standard Test Method for Density of Glass by Buoyancy", ASTM Designation: C693-93 (Reapproved 2013), 3 pgs.
"Standard Test Method for Knoop and Vickers Hardness of Materials1", ASTM Designation: E384-11є1, 2011. 43 pgs.
"Standard Test Method for Linear Thermal Expansion of Solid Materials With a Push-Rod Dilatometer1", ASTM Designation: E228-11 (Reapproved 2016), 10 pgs.
"Standard Test Method for Measurement of Glass Stress—Optical Coefficient", ASTM Designation: C770-16, 2016. 9 pgs.

(Continued)

*Primary Examiner* — Elizabeth A. Bolden
(74) *Attorney, Agent, or Firm* — Kevin M. Johnson

(57) ABSTRACT

A group of glass compositions in the $Li_2O$—$Al_2O_3$—$SiO_2$—$B_2O_3$ family that can be chemically strengthened in single or multiple ion exchange baths containing at least one of $NaNO_3$ and $KNO_3$ for a short time (2-4 hours) to develop a deep depth of layer (DOL). In some instances, the DOL is at least 70 µm; in others, at least about 100 µm. The ion exchanged glasses have a high damage resistance (indentation fracture toughness ranging form greater than 10 kgf to greater than 50 kgf) that is better than or at least comparable to that of sodium aluminosilicate glasses.

15 Claims, 5 Drawing Sheets

(56) References Cited

U.S. PATENT DOCUMENTS

2019/0084870 A1* 3/2019 Beall .................. C03C 4/18

FOREIGN PATENT DOCUMENTS

| CN | 103068759 A | 4/2013 |
|---|---|---|
| CN | 103261110 A | 8/2013 |
| CN | 104334508 A | 2/2015 |
| DE | 1421846 A1 | 11/1968 |
| GB | 0966731 A | 8/1964 |
| JP | 48-085613 A | 11/1973 |
| JP | 2001019466 A | 1/2001 |
| JP | 2002025040 A | 1/2002 |
| JP | 2002255585 A | 9/2002 |
| JP | 2002260216 A | 9/2002 |
| JP | 2003099913 A | 4/2003 |
| JP | 2004206741 A | 7/2004 |
| JP | 2011-530470 A | 12/2011 |
| JP | 2013-536155 A | 9/2013 |
| JP | 2017-081778 A | 5/2017 |
| JP | 2017081778 A * | 5/2017 |
| TW | 201217283 A | 5/2012 |
| TW | 201527240 A | 7/2015 |
| WO | 2011/103799 A1 | 9/2011 |
| WO | 2011/104035 A2 | 9/2011 |
| WO | 2012/027660 A1 | 3/2012 |
| WO | 2013/027675 A1 | 2/2013 |
| WO | 2013/105625 A1 | 7/2013 |
| WO | 2015/162845 A1 | 10/2015 |

OTHER PUBLICATIONS

"Standard Test Method for Measurement of Viscosity of Glass Between 104 Pa's and 108 Pa's by Viscous Compression of a Solid Right Cylinder [Metric]1", ASTM Designation: C1351M-96 (Reapproved 2012), 4 pgs.

G. Rene, "Ion exchange for glass strengthening," Materials Science and Engineering: B, 149:159-165. 2008.

International Search Report and Written Opinion of the International Searching Authority; PCT/US2017/012459; dated Feb. 28, 2017; 11 pages; European Patent Office.

Holand and Beall, "Glass-ceramic technology," The American Ceramic Society, 2nd edition, Wiley & Sons, Inc., Hoboken, NJ, 2012, 440 pgs.

Japanese Patent Application No. 2018-535017 Notice of Reasons for Refusal dated Dec. 21, 2020; 7 Pages; (4 pages of English Translation and 3 pages of Original Document); Japanese Patent Office.

Chinese Patent Application No. 201780006069.7, Office Action dated Feb. 19, 2021; 5 pages (English Translation only); Chinese Patent Office.

Japanese Patent Application No. 2018-535017, Office Action dated Jun. 30, 2021, 4 pages (2 pages of English Translation and 2 pages of Original Document), Japanese Patent Office.

* cited by examiner

CHEMICALLY STRENGTHENABLE LITHIUM ALUMINOSILICATE GLASSES WITH INHERENT DAMAGE RESISTANCE

CROSS-REFERENCE TO RELATED APPLICATIONS

This application is a divisional of U.S. application Ser. No. 15/400,267, filed Jan. 6, 2017, which claims the benefit of priority under 35 U.S.C. § 119 of U.S. Provisional Application Ser. No. 62/276,431, filed Jan. 8, 2016, the contents of which are relied upon and incorporated herein by reference in their entirety.

BACKGROUND

The disclosure relates to ion exchangeable glasses. More particularly, the disclosure relates to ion exchangeable lithium aluminosilicate glasses. Even more particularly, the disclosure relates to lithium aluminosilicate glasses which, when ion exchanged, have high levels of inherent damage resistance.

There have been continuous efforts in the development of new glass compositions to improve ion exchange properties and higher damage resistance while facilitating melting and forming processes. Many glasses with high indentation threshold are based on the $SiO_2$—$Al_2O_3$—$B_2O_3$—MgO—$Na_2O$—$P_2O_5$ glass systems. The open structure (i.e. high molar volume) resulting from the existence of boron or phosphorus leads to high inherent damage resistance (IDR).

SUMMARY

A group of glass compositions in the $Li_2O$—$Al_2O_3$—$SiO_2$—$B_2O_3$ family is provided. These glasses can be chemically strengthened in single or multiple ion exchange baths containing at least one of $NaNO_3$ and $KNO_3$ for a short time (2-4 hours) to develop a deep depth of layer (DOL). In some instances, the DOL is at least 70 μm; in others, at least about 100 μm. The ion exchanged glasses have a high damage resistance (indentation fracture toughness ranging from greater than 10 kgf to greater than 50 kgf) that is better than or at least comparable to that of sodium aluminosilicate glasses.

Accordingly, one aspect of the disclosure is to provide a lithium aluminosilicate glass. The glass comprises: from about 55 mol % to about 75 mol % $SiO_2$; from about 9 mol % to about 18 mol % $Al_2O_3$; from about 2.5 mol % to about 20 mol % $B_2O_3$; from about 3 mol % to about 20 mol % $Li_2O$; and from 0 mol % to about 4 mol % $P_2O_5$.

Another aspect of the disclosure is to provide a lithium aluminosilicate glass. The glass is ion exchanged and has a compressive layer extending to a depth of layer of at least about 70 μm from at least one surface into the glass. The compressive layer having a maximum compressive stress at the surface of at least about 600 MPa. The glass also has a Vickers crack initiation threshold of at least about 10 kgf and a Knoop scratch threshold of at least about 8 N.

According to a first aspect of the disclosure a lithium aluminosilicate glass is provided. The lithium aluminosilicate glass comprises: from about 55 mol % to about 75 mol % $SiO_2$; from about 10 mol % to about 18 mol % $Al_2O_3$; from about 3.5 mol % to about 9.5 mol % $B_2O_3$; from about 7 mol % to about 14 mol % $Li_2O$; and from 0 mol % to about 4 mol % $P_2O_5$, wherein $Li_2O$(mol %)/$R_2O$(mol %) is in a range from about 0.1 to about 0.4 and $R_2O$=$Li_2O$+$Na_2O$+$K_2O$+$Rb_2O$+$Cs_2O$.

According to a second aspect of the disclosure, the lithium aluminosilicate glass of the first aspect is ion exchanged.

According to a third aspect of the disclosure, the ion exchanged lithium aluminosilicate glass of the second aspect has a compressive layer extending to a depth of layer of at least about 70 μm from at least one surface into the glass, the compressive layer having a maximum compressive stress of at least about 600 MPa.

According to a fourth aspect of the disclosure, in the ion exchanged lithium aluminosilicate glass of the third aspect the compressive layer has a compressive stress of at least about 100 MPa at a depth of 50 μm below the surface.

According to a fifth aspect of the disclosure, the ion exchanged lithium aluminosilicate glass of any of the second through fourth aspects has a Vickers crack initiation threshold of at least about 10 kgf.

According to a sixth aspect of the disclosure, the ion exchanged lithium aluminosilicate glass of any of the second through fifth aspects has a Knoop scratch threshold of at least about 8 N.

According to a seventh aspect of the disclosure, the lithium aluminosilicate glass of any of the first through sixth aspects has a liquidus viscosity of at least about 10 kP.

According to an eighth aspect of the disclosure, the lithium aluminosilicate glass of any of the first through seventh aspects has a softening point of about 840° C. or less.

According to a ninth aspect of the disclosure, the lithium aluminosilicate glass of any of the first through eighth aspects has an anneal point of at least about 510° C.

According to a tenth aspect of the disclosure, the lithium aluminosilicate glass of any of the first through ninth aspects has an elastic modulus of at least about 68 GPa.

According to an eleventh aspect of the disclosure, the lithium aluminosilicate glass of any of the first through tenth aspects is provided wherein $R_2O$(mol %)-$Al_2O_3$(mol %) is in a range from about −2 mol % to about 5.6 mol %.

According to a twelfth aspect of the disclosure, the lithium aluminosilicate glass of any of the first through eleventh aspects is provided wherein $Al_2O_3$(mol %)>$B_2O_3$(mol %).

According to a thirteenth aspect of the disclosure, the lithium aluminosilicate glass of any of the first through twelfth aspects is provided wherein the lithium aluminosilicate glass comprises: from about 58 mol % to about 69 mol % $SiO_2$; from about 10 mol % to about 17 mol % $Al_2O_3$; from about 3.5 mol % to about 9.5 mol % $B_2O_3$; from 0 mol % to about 2.5 mol % $P_2O_5$; from about 7 mol % to about 14 mol % $Li_2O$; from about 0.2 mol % to about 14 mol % $Na_2O$; from 0 mol % to about 2.5 mol % $K_2O$; from 0 mol % to about 5 mol % MgO; and from 0 mol % to about 4 mol % ZnO, wherein $Li_2O$(mol %)/$R_2O$(mol %) is in a range from about 0.1 to about 0.4.

According to a fourteenth aspect of the disclosure, the lithium aluminosilicate glass of any of the first through thirteenth aspects is provided wherein the lithium aluminosilicate glass comprises: from about 5 mol % to about 9 mol % $B_2O_3$; from about 7 mol % to about 10 mol % $Li_2O$; from about 4 mol % to about 14 mol % $Na_2O$; and from 0 mol % to about 1 mol % $K_2O$.

According to a fifteenth aspect of the disclosure, the lithium aluminosilicate glass of any of the first through fourteenth aspects is provided wherein ($Al_2O_3$(mol %)+$B_2O_3$(mol %))/$R_2O$(mol %) is in a range from about 0.9 to about 1.9.

According to a sixteenth aspect of the disclosure, the lithium aluminosilicate glass of any of the first through fifteenth aspects is provided wherein $R_2O(mol\ \%)+R'O(mol\ \%)-Al_2O_3(mol\ \%)-B_2O_3(mol\ \%)-P_2O_5(mol\ \%)$ is in a range from about −10.5 mol % to about −0.11 mol %, where $R'O=MgO+CaO+SrO+BaO$.

According to a seventeenth aspect of the disclosure, the lithium aluminosilicate glass of any of the first through sixteenth aspects is provided wherein the lithium aluminosilicate glass comprises from about 5 mol % to about 12 mol % $Li_2O$.

According to an eighteenth aspect of the disclosure, the lithium aluminosilicate glass of any of the first through seventeenth aspects is provided wherein the lithium aluminosilicate glass comprises: from 0 mol % to about 5 mol % $Na_2O$; from 0 mol % to about 4 mol % $K_2O$; from 0 mol % to about 8 mol % MgO; from 0 mol % to about 4 mol % ZnO; from 0 mol % to about 5 mol % $TiO_2$; and from 0 mol % to about 3 mol % $P_2O_5$.

According to a nineteenth aspect of the disclosure, the lithium aluminosilicate glass of any of the first through eighteenth aspects is provided wherein the lithium aluminosilicate glass comprises: from about 55 mol % to about 60 mol % $SiO_2$; from about 12 mol % to about 15 mol % $Al_2O_3$; from about 3.5 mol % to about 7.5 mol % $B_2O_3$; from about 7 mol % to about 10 mol % $Li_2O$; and from 0 mol % to about 3 mol % $P_2O_5$.

According to a twentieth aspect of the disclosure, the lithium aluminosilicate glass of any of the first through nineteenth aspects is provided wherein the lithium aluminosilicate glass comprises from about 5 mol % to about 7 mol % $B_2O_3$.

According to a twenty-first aspect of the disclosure, the lithium aluminosilicate glass of any of the first through twentieth aspects is provided wherein the lithium aluminosilicate glass comprises: from 0 mol % to about 5 mol % $Na_2O$; and from about 0.05 mol % to about 0.5 mol % $SnO_2$.

According to a twenty-second aspect of the disclosure a consumer electronic product is provided. The consumer electronic product comprises: a housing having a front surface, a back surface and side surfaces; electrical components provided at least partially within the housing, the electrical components including at least a controller, a memory, and a display, the display being provided at or adjacent the front surface of the housing; and a cover glass disposed over the display, wherein at least one of a portion of the housing or the cover glass comprises the lithium aluminosilicate glass of any of the first through twenty-first aspects.

According to a twenty-third aspect of the disclosure a consumer electronic product is provided. The lithium aluminosilicate glass comprises: from about 55 mol % to about 75 mol % $SiO_2$; from about 10 mol % to about 18 mol % $Al_2O_3$; from about 2.5 mol % to about 7.5 mol % $B_2O_3$; from about 5 mol % to about 14 mol % $Li_2O$; from 0 mol % to about 4 mol % $P_2O_5$; and from 0 mol % to about 1 mol % $K_2O$; wherein $Li_2O(mol\ \%)/R_2O(mol\ \%)$ is in a range from about 0.1 to about 0.4, $R_2O=Li_2O+Na_2O+K_2O+Rb_2O+Cs_2O$, $R_2O(mol\ \%)+R'O(mol\ \%)-Al_2O_3(mol\ \%)-B_2O_3(mol\ \%)-P_2O_5(mol\ \%)$ is in a range from about −10.5 mol % to about −0.11 mol %, and $R'O=MgO+CaO+SrO+BaO$.

According to a twenty-fourth aspect of the disclosure, the lithium aluminosilicate glass of the twenty-third aspect is ion exchanged.

According to a twenty-fifth aspect of the disclosure, the ion exchanged lithium aluminosilicate glass of the twenty-fourth aspect has a compressive layer extending to a depth of layer of at least about 70 μm from at least one surface into the glass, the compressive layer having a maximum compressive stress of at least about 600 MPa.

According to a twenty-sixth aspect of the disclosure, in the ion exchanged lithium aluminosilicate glass of the twenty-fifth aspect the compressive layer has a compressive stress of at least about 100 MPa at a depth of 50 μm below the surface.

According to a twenty-seventh aspect of the disclosure, the lithium aluminosilicate glass of any of the twenty-third through twenty-sixth aspects has a Vickers crack initiation threshold of at least about 10 kgf.

According to a twenty-eighth aspect of the disclosure, the lithium aluminosilicate glass of any of the twenty-third through twenty-seventh aspects has a Knoop scratch threshold of at least about 8 N.

According to a twenty-ninth aspect of the disclosure, the lithium aluminosilicate glass of any of the twenty-third through twenty-eighth aspects has a liquidus viscosity of at least about 10 kP.

According to a thirtieth aspect of the disclosure, the lithium aluminosilicate glass of any of the twenty-third through twenty-ninth aspects has a softening point of about 840° C. or less.

According to a thirty-first aspect of the disclosure, the lithium aluminosilicate glass of any of the twenty-third through thirtieth aspects has an anneal point of at least about 510° C.

According to a thirty-second aspect of the disclosure, the lithium aluminosilicate glass of any of the twenty-third through thirty-first aspects has an elastic modulus of at least about 68 GPa.

According to a thirty-third aspect of the disclosure, the lithium aluminosilicate glass of any of the twenty-third through thirty-second aspects is provided wherein $R_2O(mol\ \%)-Al_2O_3(mol\ \%)$ is in a range from about −2 mol % to about 5.6 mol %.

According to a thirty-fourth aspect of the disclosure, the lithium aluminosilicate glass of any of the twenty-third through thirty-third aspects is provided wherein $Al_2O_3(mol\ \%)>B_2O_3(mol\ \%)$.

According to a thirty-fifth aspect of the disclosure, the lithium aluminosilicate glass of any of the twenty-third through thirty-fourth aspects is provided wherein $(Al_2O_3(mol\ \%)+B_2O_3(mol\ \%))/R_2O(mol\ \%)$ is in a range from about 0.9 to about 1.9.

According to a thirty-sixth aspect of the disclosure, the lithium aluminosilicate glass of any of the twenty-third through thirty-fifth aspects is provided wherein the lithium aluminosilicate glass comprises: from 0 mol % to about 5 mol % $Na_2O$; from 0 mol % to about 8 mol % MgO; from 0 mol % to about 4 mol % ZnO; from 0 mol % to about 5 mol % $TiO_2$; and from 0 mol % to about 3 mol % $P_2O_5$.

According to a thirty-seventh aspect of the disclosure, the lithium aluminosilicate glass of any of the twenty-third through thirty-sixth aspects is provided wherein the lithium aluminosilicate glass comprises from about 5 mol % to about 7 mol % $B_2O_3$.

According to a thirty-eighth aspect of the disclosure, the lithium aluminosilicate glass of any of the twenty-third through thirty-seventh aspects is provided wherein the lithium aluminosilicate glass comprises: from 0 mol % to about 5 mol % $Na_2O$; and from about 0.05 mol % to about 0.5 mol % $SnO_2$.

According to a thirty-ninth aspect of the disclosure a consumer electronic product is provided. The consumer electronic product comprises: a housing having a front surface, a back surface and side surfaces; electrical components provided at least partially within the housing, the electrical components including at least a controller, a memory, and a display, the display being provided at or adjacent the front surface of the housing; and a cover glass disposed over the display, wherein at least one of a portion of the housing or the cover glass comprises the lithium aluminosilicate glass of any of the twenty-third through thirty-eighth aspects.

According to a fortieth aspect of the disclosure a lithium aluminosilicate glass is provided. The lithium aluminosilicate glass is ion exchanged and has a compressive layer extending to a depth of layer of at least about 70 μm from at least one surface into the glass, the compressive layer having a maximum compressive stress of at least about 600 MPa, wherein the glass has a Vickers crack initiation threshold of at least about 10 kgf and a Knoop scratch threshold of at least about 8 N.

According to a forty-first aspect of the disclosure a consumer electronic product is provided. The consumer electronic product comprises: a housing having a front surface, a back surface and side surfaces; electrical components provided at least partially within the housing, the electrical components including at least a controller, a memory, and a display, the display being provided at or adjacent the front surface of the housing; and a cover glass disposed over the display, wherein at least one of a portion of the housing or the cover glass comprises the lithium aluminosilicate glass of the fortieth aspect.

These and other aspects, advantages, and salient features of the present disclosure will become apparent from the following detailed description, the accompanying drawings, and the appended claims.

DETAILED DESCRIPTION

Figure 1:
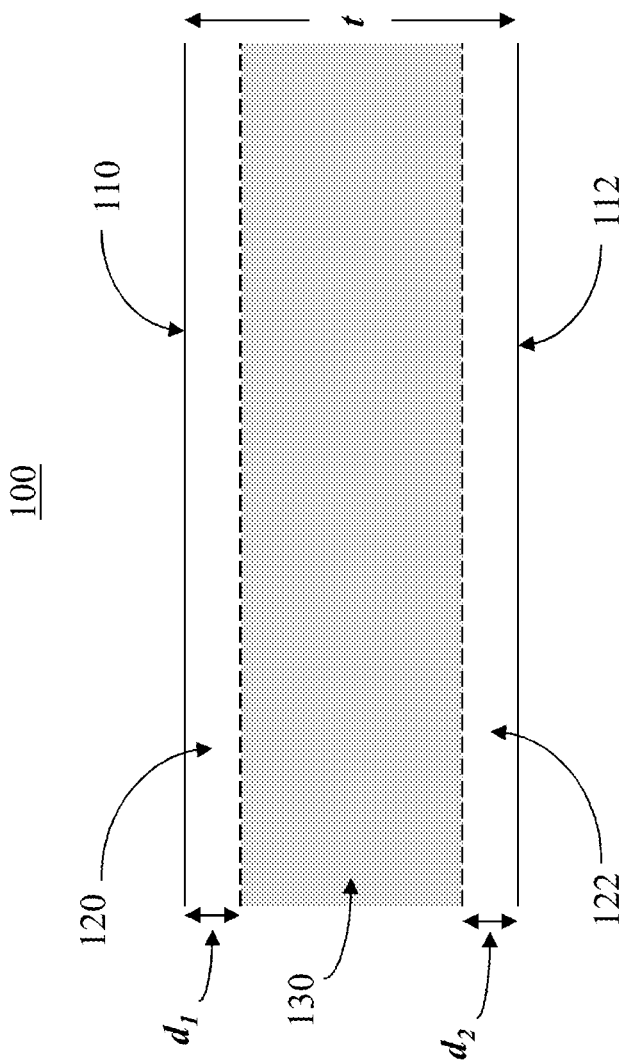
FIG. 1 is a cross-sectional schematic view of an ion exchanged glass article.

In the following description, like reference characters designate like or corresponding parts throughout the several views shown in the figures. It is also understood that, unless otherwise specified, terms such as "top," "bottom," "outward," "inward," and the like are words of convenience and are not to be construed as limiting terms. In addition, whenever a group is described as comprising at least one of a group of elements and combinations thereof, it is understood that the group may comprise, consist essentially of, or consist of any number of those elements recited, either individually or in combination with each other. Similarly, whenever a group is described as consisting of at least one of a group of elements or combinations thereof, it is understood that the group may consist of any number of those elements recited, either individually or in combination with each other. Unless otherwise specified, a range of values, when recited, includes both the upper and lower limits of the range as well as any ranges therebetween. As used herein, the indefinite articles "a," "an," and the corresponding definite article "the" mean "at least one" or "one or more," unless otherwise specified. It also is understood that the various features disclosed in the specification and the drawings can be used in any and all combinations.

As used herein, the terms "glass article" and "glass articles" are used in their broadest sense to include any object made wholly or partly of glass. Unless otherwise specified, all compositions are expressed in terms of mole percent (mol %). Coefficients of thermal expansion (CTE) are expressed in terms of $10^{-7}$/° C. and represent a value measured over a temperature range from about 20° C. to about 300° C., unless otherwise specified.

Unless otherwise specified, all temperatures are expressed in terms of degrees Celsius (° C.). As used herein the term "softening point" refers to the temperature at which the viscosity of a glass is approximately $10^{7.6}$ poise (P), the term "anneal point" refers to the temperature at which the viscosity of a glass is approximately $10^{13.2}$ poise, the term "200 poise temperature ($T^{200i}$)" refers to the temperature at which the viscosity of a glass is approximately 200 poise, the term "1 poise temperature ($T^{200i}$)" refers to the temperature at which the viscosity of a glass is approximately 200 poise, the term "$10^{11}$ poise temperature" refers to the temperature at which the viscosity of a glass is approximately $10^{11}$ poise, the term "35 kP temperature ($T^{35kP}$)" refers to the temperature at which the viscosity of a glass is approximately 35 kilopoise (kP), and the term "160 kP temperature ($T^{160kP}$)" refers to the temperature at which the viscosity of a glass is approximately 160 kP. As used herein, the term "liquidus temperature," or "$T^L$" refers to the temperature at which crystals first appear as a molten glass cools down from the melting temperature, or the temperature at which the very last crystals melt away as temperature is increased from room temperature.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue. Thus, a glass that is "substantially free of MgO" is one in which MgO is not actively added or batched into the glass, but may be present in very small amounts (e.g., less than 0.1 mol %) as a contaminant.

Referring to the drawings in general and to FIG. 1 in particular, it will be understood that the illustrations are for the purpose of describing particular embodiments and are not intended to limit the disclosure or appended claims thereto. The drawings are not necessarily to scale, and certain features and certain views of the drawings may be shown exaggerated in scale or in schematic in the interest of clarity and conciseness.

Described herein are ion exchangeable lithium aluminosilicate glasses that exhibit high levels of damage resistance—also referred to as native damage resistance or inherent damage resistance—as characterized by Vickers crack initiation threshold and Knoop scratch testing, when chemically strengthened. These glasses may in general be ion exchanged in sodium salts (e.g., NaNO$_3$) at faster rates than analogous sodium alkali aluminosilicate glasses are ion exchanged in potassium salts (e.g., KNO$_3$). Deeper depths of compression (also referred to as "depth of layer" or "DOL") may also be achieved at lower temperatures with the lithium-containing glasses. When Na+ replaces Li+ in the glass, the rate of diffusion may be about 10 times faster than exchange of K$^+$ for Na$^+$ in the glass. Mixed salt baths may be used to allow for dual ion exchange in which both K$^+$ for Na$^+$ and Na$^+$ for Li$^+$ exchange occur, resulting in a deep depth of compression due to the Na$^+$ for Li$^+$ exchange and high surface compressive stress due to the K$^+$ for Na$^+$ exchange.

The lithium aluminosilicate glasses described herein comprise or consist essentially of: from about 55 mol % to about 75 mol % SiO$_2$ (55 mol %≤SiO$_2$≤75 mol %); from about 9 mol % to about 18 mol % Al$_2$O$_3$ (9 mol %≤Al$_2$O$_3$≤18 mol %); from about 2.5 mol % to about 20 mol % B$_2$O$_3$ (2.5 mol %≤B$_2$O$_3$≤20 mol %); from about 3 mol % to about 20 mol % Li$_2$O (3 mol %≤Li$_2$O≤20 mol %); and from 0 mol % to about 4 mol % P$_2$O$_5$ (0 mol %≤P$_2$O$_5$≤4 mol %). In some embodiments, the glass further comprises at least one of: from 0 mol % to about 5 mol % Na$_2$O; from 0 mol % to about 4 mol % K$_2$O; from 0 mol % to about 8 mol % MgO; from 0 mol % to about 4 mol % ZnO, and from 0 mol % to about 5 mol % TiO$_2$.

In particular embodiments, the lithium aluminosilicate glasses described herein comprise or consist essentially of: from about 55 mol % to about 75 mol % SiO$_2$, from about 10 mol % to about 18 mol % Al$_2$O$_3$; from 0 mol % to about 20 mol % B$_2$O$_3$; from about 5 mol % to about 14 mol % Li$_2$O; from 0 mol % to about 5 mol % Na$_2$O; from 0 mol % to about 4 mol % K$_2$O; from 0 mol % to about 8 mol % MgO; from 0 mol % to about 4 mol % ZnO; from 0 mol % to about 5 mol % TiO$_2$; from 0 mol % to about 4 mol % P$_2$O$_5$, and from about 0.05 mol % to about 0.5 mol % SnO$_2$. Even more particularly, the glass may comprise or consist essentially of: from about 55 mol % to about 60 mol % SiO$_2$ (55 mol %≤SiO$_2$≤60 mol %); from about 12 mol % to about 15 mol % Al$_2$O$_3$ (12 mol %≤Al$_2$O$_3$≤15 mol %); from about 2.5 mol % to about 7.5 mol % B$_2$O$_3$ (2.5 mol %≤B$_2$O$_3$≤7.5 mol %); from about 7 mol % to about 10 mol % Li$_2$O (7 mol %≤Li$_2$O≤10 mol %); and from 0 mol % to about 3 mol % P$_2$O$_5$ (0 mol %≤P$_2$O$_5$≤3 mol %). Most preferably, B$_2$O$_3$ is in a range from about 5 mol % to about 7 mol %. Non-limiting examples of the compositions of such glasses and a reference composition (9667) are listed in Table 1.

TABLE 1

Examples of the lithium aluminosilicate glasses.

| mol % oxide | Reference 9667 | 1 REN | 2 REO | 3 RET | 4 RGC | 5 RDD |
|---|---|---|---|---|---|---|
| SiO$_2$ | 69.2 | 65.0 | 63.0 | 59.3 | 63.3 | 67.3 |
| Al$_2$O$_3$ | 12.6 | 14.4 | 15.5 | 15.4 | 15.3 | 13.5 |
| B$_2$O$_3$ | 1.8 | 2.3 | 2.3 | 6.0 | 6.0 | 2.0 |
| Li$_2$O | 7.7 | 8.8 | 9.7 | 9.7 | 9.6 | 7.7 |
| Na$_2$O | 0.4 | 0.6 | 0.6 | 0.6 | 0.6 | 0.6 |
| MgO | 2.9 | 4.0 | 4.0 | 4.0 | 4.0 | 4.0 |
| ZnO | 1.7 | 1.2 | 1.2 | 1.2 | 1.2 | 1.2 |
| TiO$_2$ | 3.5 | 3.5 | 3.5 | 3.6 | 0.0 | 3.5 |
| SnO$_2$ | 0.2 | 0.2 | 0.2 | 0.2 | 0.2 | 0.2 |
| P$_2$O$_5$ | 0 | 0 | 0 | 0 | 0 | 0 |

| mol % oxide | 6 RDE | 7 RDF | 8 RDG | 9 RDH | 10 RDI | 11 RFX |
|---|---|---|---|---|---|---|
| SiO$_2$ | 65.9 | 64.7 | 63.4 | 62.3 | 61.0 | 68.9 |
| Al$_2$O$_3$ | 13.2 | 13.0 | 12.7 | 12.5 | 12.2 | 13.9 |

TABLE 1-continued

Examples of the lithium aluminosilicate glasses.

| | | | | | | |
|---|---|---|---|---|---|---|
| B$_2$O$_3$ | 4.0 | 5.8 | 7.6 | 9.2 | 10.9 | 2.4 |
| Li$_2$O | 7.5 | 7.5 | 7.3 | 7.1 | 7.1 | 7.9 |
| Na$_2$O | 0.6 | 0.6 | 0.6 | 0.6 | 0.5 | 0.6 |
| MgO | 4.0 | 3.8 | 3.8 | 3.7 | 3.7 | 4.1 |
| ZnO | 1.2 | 1.1 | 1.1 | 1.1 | 1.1 | 1.2 |
| TiO$_2$ | 3.4 | 3.4 | 3.3 | 3.3 | 3.2 | 0 |
| SnO$_2$ | 0.2 | 0.2 | 0.2 | 0.2 | 0.2 | 0.1 |
| P$_2$O$_5$ | 0 | 0 | 0 | 0 | 0 | 0.9 |

| mol % oxide | 12 RFY | 13 RFZ | 14 RGA | 15 RGB |
|---|---|---|---|---|
| SiO$_2$ | 68.2 | 67.6 | 66.9 | 69.5 |
| Al$_2$O$_3$ | 13.8 | 13.6 | 13.5 | 14.0 |
| B$_2$O$_3$ | 2.3 | 2.3 | 2.3 | 2.4 |
| Li$_2$O | 7.9 | 7.8 | 7.7 | 8.0 |
| Na$_2$O | 0.6 | 0.6 | 1.7 | 0.6 |
| MgO | 4.0 | 4.0 | 4.0 | 4.1 |
| ZnO | 1.2 | 1.2 | 1.2 | 1.2 |
| TiO$_2$ | 0 | 0 | 0 | 0 |
| SnO$_2$ | 0.1 | 0.1 | 0.1 | 0.1 |
| P$_2$O$_5$ | 1.8 | 2.7 | 2.7 | 0.0 |

In particular embodiments, the lithium aluminosilicate glasses described herein comprise or consist essentially of: from about 58 mol % to about 69 mol % SiO$_2$ (58 mol %≤SiO$_2$≤69 mol %); from about 9 mol % to about 17 mol % Al$_2$O$_3$ (9 mol %≤Al$_2$O$_3$≤17 mol %); from about 3.5 mol % to about 9.5 mol % B$_2$O$_3$ (3.5 mol %≤B$_2$O$_3$≤9.5 mol %); from 0 mol % to about 2.5 mol % P$_2$O$_5$ (0 mol %≤P$_2$O$_5$≤4 mol %); from about 2.5 mol % to about 12 mol % Li$_2$O (2.5 mol %≤Li$_2$O≤12 mol %); from about 0.2 mol % to about 12 mol % Na$_2$O (0.2 mol %≤Na$_2$O≤13 mol %); from 0 mol % to about 2.5 mol % K$_2$O (0 mol %≤K$_2$O≤2.5 mol %); 0 mol % to about 5 mol % MgO (0 mol %≤MgO≤5 mol %); and/or from 0 mol % to about 4 mol % ZnO (0 mol %≤ZnO≤4 mol %). More particularly, the glass may comprise: from about 5 mol % to about 9 mol % B$_2$O$_3$ (5 mol %≤B$_2$O$_3$≤9 mol %); from about 4 mol % to about 10 mol % Li$_2$O (4 mol %≤Li$_2$O≤10 mol %); from about 4 mol % to about 14 mol % Na$_2$O (4 mol %≤Na$_2$O≤14 mol %); from 0 mol % to about 1 mol % K$_2$O (0 mol %≤K$_2$O≤1 mol %); 0 mol % to about 3 mol % MgO (0 mol %≤MgO≤3 mol %); and/or from 0 mol % to about 3 mol % ZnO (0 mol %≤ZnO≤3 mol %). These glasses may further include from about 0.05 mol % to about 0.5 mol % SnO$_2$ (0.05 mol %≤SnO$_2$≤0.5 mol %). Non-limiting examples of the compositions of such glasses are listed in Table 2.

In some embodiments, (Li$_2$O(mol %)/R$_2$O(mol %)) is in a range from about 0.1 to about 0.5 (0.1≤(Li$_2$O(mol %)/R$_2$O (mol %)≤0.5), where R$_2$O=Li$_2$O+Na$_2$O+K$_2$O+Rb$_2$O+Cs$_2$O.

In some embodiments, R$_2$O(mol %)-Al$_2$O$_3$(mol %) is in a range from about −2 mol % to about 5.6 mol %, where R$_2$O=Li$_2$O+Na$_2$O+K$_2$O+Rb$_2$O+Cs$_2$O. In some embodiments, Al$_2$O$_3$(mol %)>B$_2$O$_3$(mol %). In some embodiments, (Al$_2$O$_3$(mol %)+B$_2$O$_3$(mol %))/R$_2$O(mol %) is in a range from about 0.9 to about 1.9. In some embodiments, R$_2$O(mol %)+R'O(mol %)-Al$_2$O$_3$(mol %)-B$_2$O$_3$(mol %)-P$_2$O$_5$(mol %) is in a range from about −10.5 mol % to about −0.11 mol %, where R'O=MgO+CaO+SrO+BaO.

In some embodiments, the lithium aluminosilicate glasses described herein have softening points that are lower than sodium analogs, which typically have softening points of greater than about 900° C. In some embodiments, the glasses described herein have softening points of about 840° C. or less. In certain embodiments, the glass has a softening point of about 820° C. or less and, in still other embodiments, about 800° C. or less. These low softening points are accompanied by coefficients of thermal expansion (CTE) that are lower than those of sodium analogs. Lower CTE is important in maintaining dimensional stability when reforming glass sheets. In addition to use as flat plates, the relatively low CTEs of the present glasses enable their use as three-dimensional articles and in automotive applications.

In some embodiments, the lithium aluminosilicate glasses described herein have an anneal point of at least about 500° C. In certain embodiments the glass has an anneal point of at least about 520° C. and, in still other embodiments, the anneal point is at least about 530° C.

Densities, strain points, softening points, anneal points, and coefficients of thermal expansion (CTE) for selected glass compositions are listed in Table 2.

TABLE 2

Compositions, densities, strain points, softening points, anneal points, and coefficients of thermal expansion (CTE) of selected lithium aluminosilicate glasses.

| mol % | 196HNT | 107UE | 107UF | 107UG | 107UH | 107UI |
|---|---|---|---|---|---|---|
| $SiO_2$ | 67.00 | 67.11 | 67.18 | 66.96 | 67.17 | 67.20 |
| $Al2O_3$ | 12.60 | 9.14 | 10.12 | 9.13 | 10.15 | 10.15 |
| $B_2O_3$ | 7.10 | 0.00 | 0.00 | 0.00 | 0.00 | 0.00 |
| $Li_2O$ | 5.10 | 8.10 | 7.66 | 6.28 | 5.24 | 5.23 |
| $Na_2O$ | 6.70 | 11.38 | 10.86 | 13.26 | 13.27 | 13.31 |
| $K_2O$ | 1.30 | 0.26 | 0.27 | 0.26 | 0.26 | 0.27 |
| MgO | | 1.17 | 1.08 | 1.29 | 1.12 | 1.75 |
| CaO | | 1.82 | 1.82 | 1.80 | 1.78 | 1.09 |
| $SnO_2$ | 0.10 | 0.00 | 0.00 | 0.00 | 0.00 | 0.00 |
| $R_2O - Al_2O_3$ | 0.50 | | | | | |
| $Li_2O/(R_2O)$ | 0.389 | 0.410 | 0.408 | 0.317 | 0.279 | 0.278 |
| Strain Pt. (° C.) | | 459.1 | 473.2 | 462.8 | 482.3 | 482.3 |
| Anneal Pt. (° C.) | | 500.2 | 514.1 | 504.5 | 525.6 | 524.9 |
| Softening Pt. (° C.) | | 691.8 | 719.3 | 703.8 | 733 | 739.7 |
| CTE ($\times 10^{-7}$/° C.) | | 87.8 | 84.2 | 89.9 | 86.9 | 87 |
| Density (g/cm$^3$) | | 2.474 | 2.471 | 2.479 | 2.477 | 2.473 |

| mol % | 107UJ | 107UK | 107UL | 107UM | 107UN | 107UO |
|---|---|---|---|---|---|---|
| $SiO_2$ | 67.01 | 70.21 | 70.17 | 70.14 | 71.17 | 71.19 |
| $Al2O_3$ | 10.14 | 8.51 | 8.50 | 8.49 | 7.47 | 6.88 |
| $B_2O_3$ | 0.00 | 0.00 | 0.00 | 0.00 | 0.00 | 0.00 |
| $Li_2O$ | 6.30 | 5.45 | 6.49 | 6.93 | 5.33 | 5.28 |
| $Na_2O$ | 11.32 | 11.30 | 10.32 | 9.82 | 11.49 | 12.09 |
| $K_2O$ | 0.27 | 0.98 | 0.99 | 0.99 | 0.99 | 0.98 |
| MgO | 2.15 | 1.02 | 0.99 | 1.06 | 1.02 | 1.04 |
| CaO | 1.80 | 1.53 | 1.53 | 1.55 | 1.53 | 1.52 |
| $SnO_2$ | 0.00 | 0.00 | 0.00 | 0.00 | 0.00 | 0.00 |
| $R_2O - Al_2O_3$ | | | | | | |
| $Li_2O/(R_2O)$ | 0.352 | 0.307 | 0.365 | 0.391 | 0.299 | 0.288 |
| Strain Pt. (° C.) | 485.5 | 469.2 | 466.8 | 464.2 | 460.5 | 452.8 |
| Anneal Pt. (° C.) | 529 | 511.6 | 509.5 | 506.9 | 502.5 | 495.3 |
| Softening Pt. (° C.) | 741 | 728.6 | 720.1 | 714.1 | 712.3 | 702.7 |
| CTE ($\times 10^{-7}$/° C.) | 83.3 | 84.2 | 83.1 | 82.4 | 84.5 | 85.3 |
| Density (g/cm$^3$) | 2.474 | 2.458 | 2.455 | 2.453 | 2.454 | 2.452 |

| mol % | 107UP | 107UQ | 107UR | 107US | 107UT | 107UU |
|---|---|---|---|---|---|---|
| $SiO_2$ | 69.60 | 66.42 | 66.49 | 66.27 | 66.33 | 65.31 |
| $Al2O_3$ | 7.78 | 9.39 | 9.38 | 8.09 | 8.09 | 6.98 |
| $B_2O_3$ | 0.00 | 0.00 | 0.00 | 0.00 | 0.00 | 0.00 |
| $Li_2O$ | 5.10 | 6.39 | 6.37 | 11.73 | 10.66 | 9.65 |
| $Na_2O$ | 12.90 | 11.57 | 11.60 | 9.98 | 9.97 | 10.48 |
| $K_2O$ | 0.98 | 1.23 | 1.23 | 0.01 | 0.01 | 1.49 |
| MgO | 1.08 | 0.05 | 0.04 | 0.03 | 0.04 | 0.51 |
| CaO | 1.55 | 3.55 | 2.51 | 1.05 | 2.08 | 2.59 |
| $SnO_2$ | 0.00 | 0.00 | 0.00 | 0.00 | 0.00 | 0.00 |
| $R_2O - Al_2O_3$ | | | | | | |
| $Li_2O/(R_2O)$ | 0.269 | 0.333 | 0.332 | 0.540 | 0.516 | 0.446 |
| Strain Pt. (° C.) | 452.6 | 474.5 | 484 | 460.6 | 466.7 | 452.7 |
| Anneal Pt. (° C.) | 494.2 | 515.5 | 526.7 | 499.5 | 506.9 | 492.3 |
| Softening Pt. (° C.) | 697 | 711.3 | 732.2 | 693.2 | 697.6 | 678.6 |
| CTE ($\times 10^{-7}$/° C.) | 90.5 | 90.1 | 87.6 | 86.7 | 84.9 | 92.5 |
| Density (g/cm$^3$) | 2.468 | 2.499 | 2.519 | 2.51 | 2.519 | 2.539 |

| mol % | 107UV | 107UW | 107UX | 107UY | 107UZ | 107VA |
|---|---|---|---|---|---|---|
| $SiO_2$ | 65.28 | 65.86 | 67.91 | 69.80 | 68.09 | 67.98 |
| $Al2O_3$ | 6.96 | 9.56 | 8.99 | 8.49 | 10.01 | 10.99 |
| $B_2O_3$ | 0.00 | 0.00 | 0.00 | 0.00 | 0.00 | 0.00 |
| $Li_2O$ | 9.67 | 8.42 | 7.96 | 7.40 | 6.77 | 5.91 |
| $Na_2O$ | 10.49 | 11.70 | 10.94 | 10.36 | 10.96 | 10.94 |
| $K_2O$ | 2.48 | 0.27 | 0.27 | 0.24 | 0.25 | 0.27 |

TABLE 2-continued

Compositions, densities, strain points, softening points, anneal points, and coefficients of thermal expansion (CTE) of selected lithium aluminosilicate glasses.

| | | | | | | |
|---|---|---|---|---|---|---|
| MgO | 0.03 | 1.09 | 1.03 | 0.98 | 1.02 | 1.02 |
| CaO | 2.07 | 1.90 | 1.79 | 1.69 | 1.78 | 1.78 |
| $SnO_2$ | 0.00 | 0.11 | 0.10 | 0.09 | 0.10 | 0.10 |
| $R_2O-Al_2O_3$ | | | | | | |
| $Li_2O/(R_2O)$ | 0.427 | 0.413 | 0.415 | 0.411 | 0.376 | 0.345 |
| Strain Pt. (° C.) | 448.3 | 464 | 464 | 469 | 484 | 503 |
| Anneal Pt. (° C.) | 486.2 | 505 | 506 | 511 | 526 | 548 |
| Softening Pt. (° C.) | 671.5 | 697 | 706 | 716 | 737 | 772 |
| CTE ($\times 10^{-7}$/° C.) | 84.2 | 90.4 | 86.7 | 86.3 | 83.8 | 82 |
| Density (g/cm³) | 2.537 | 2.485 | 2.472 | 2.458 | 2.47 | 2.468 |

| mol % | 107VB | 107VC | 107VD | 107VE | 107VF | 107VG |
|---|---|---|---|---|---|---|
| $SiO_2$ | 67.98 | 67.26 | 66.04 | 65.24 | 66.39 | 66.15 |
| $Al2O_3$ | 9.00 | 9.43 | 9.95 | 10.46 | 8.99 | 10.98 |
| $B_2O_3$ | 0.00 | 0.00 | 0.00 | 0.00 | 0.00 | 0.00 |
| $Li_2O$ | 7.92 | 7.78 | 7.82 | 7.77 | 7.56 | 7.76 |
| $Na_2O$ | 10.96 | 11.39 | 11.96 | 12.37 | 11.94 | 11.93 |
| $K_2O$ | 0.26 | 0.26 | 0.27 | 0.26 | 0.26 | 0.27 |
| MgO | 1.34 | 1.00 | 1.04 | 1.01 | 1.00 | 1.03 |
| CaO | 1.42 | 1.78 | 1.82 | 1.77 | 1.77 | 1.78 |
| $SnO_2$ | 0.10 | 0.10 | 0.10 | 0.10 | 0.10 | 0.10 |
| $R_2O-Al_2O_3$ | | | | | | |
| $Li_2O/(R_2O)$ | 0.414 | 0.400 | 0.390 | 0.381 | 0.382 | 0.389 |
| Strain Pt. (° C.) | 466 | 463 | 465 | 468 | 470 | 460 |
| Anneal Pt. (° C.) | 508 | 505 | 506 | 508 | 512 | 501 |
| Softening Pt. (° C.) | 707 | 706 | 702 | 706 | 712 | 697 |
| CTE ($\times 10^{-7}$/° C.) | 86.3 | 86.7 | 89.4 | 89.4 | 88.3 | 89.7 |
| Density (g/cm³) | 2.469 | 2.401 | 2.407 | 2.432 | 2.411 | 2.38 |

| mol % | 107VH | 107VI | 107VJ | 107VK | 107VL | 107VM |
|---|---|---|---|---|---|---|
| $SiO_2$ | 65.17 | 65.52 | 64.53 | 63.51 | 62.63 | 61.19 |
| $Al_2O_3$ | 9.96 | 5.11 | 6.46 | 7.71 | 9.04 | 10.39 |
| $B_2O_3$ | 0.00 | 0.00 | 0.00 | 0.00 | 0.00 | 0.00 |
| $Li_2O$ | 7.73 | 12.67 | 11.95 | 11.23 | 10.52 | 10.05 |
| $Na_2O$ | 11.94 | 12.40 | 12.78 | 13.29 | 13.59 | 14.13 |
| $K_2O$ | 0.27 | 0.27 | 0.27 | 0.27 | 0.26 | 0.27 |
| MgO | 1.78 | 1.05 | 1.05 | 1.04 | 1.03 | 1.04 |
| CaO | 2.04 | 1.85 | 1.83 | 1.84 | 1.80 | 1.81 |
| $SnO_2$ | 0.10 | 0.10 | 0.10 | 0.10 | 0.10 | 0.10 |
| $R_2O-Al_2O_3$ | | | | | | |
| $Li_2O/(R_2O)$ | 0.388 | 0.500 | 0.478 | 0.453 | 0.432 | 0.411 |
| Strain Pt. (° C.) | 465 | 412 | 416 | 426 | 435 | 443 |
| Anneal Pt. (° C.) | 506 | 447 | 453 | 462 | 471 | 481 |
| Softening Pt. (° C.) | 701 | 602 | 616 | 626 | 640 | 655 |
| CTE ($\times 10^{-7}$/° C.) | 90.1 | 105.9 | 104.8 | 103.5 | 103.3 | 101.7 |
| Density (g/cm³) | 2.413 | 2.485 | 2.49 | 2.495 | 2.499 | 2.511 |

| mol % | 107VN | 107VU | 107VW | 107VX | 107VY | 107VZ |
|---|---|---|---|---|---|---|
| $SiO_2$ | 60.07 | 68.95 | 66.00 | 66.12 | 68.85 | 68.81 |
| $Al_2O_3$ | 11.72 | 9.97 | 9.96 | 9.98 | 9.96 | 9.94 |
| $B_2O_3$ | 0.00 | 0.00 | 0.00 | 0.00 | 0.00 | 0.00 |
| $Li_2O$ | 9.21 | 7.96 | 5.00 | 4.99 | 7.98 | 9.94 |
| $Na_2O$ | 14.75 | 4.94 | 7.90 | 7.90 | 4.96 | 2.98 |
| $K_2O$ | 0.26 | 0.99 | 0.99 | 0.99 | 0.99 | 1.01 |
| MgO | 1.06 | 3.57 | 3.59 | 3.50 | 5.10 | 2.04 |
| CaO | 1.82 | 1.54 | 1.53 | 1.52 | 2.05 | 5.17 |
| $SnO_2$ | 0.10 | 0.09 | 0.10 | 0.09 | 0.10 | 0.10 |
| $R_2O-Al_2O_3$ | | | | | | |
| $Li_2O/(R_2O)$ | 0.380 | 0.573 | 0.360 | 0.359 | 0.573 | 0.714 |
| Strain Pt. (° C.) | 452 | 546.8 | 524.5 | 566.4 | 511.7 | 500.4 |
| Anneal Pt. (° C.) | 492 | 592.6 | 570.9 | 611.2 | 556.4 | 541.5 |
| Softening Pt. (° C.) | 672 | 825 | 812.3 | 830.7 | N/A | N/A |
| CTE ($\times 10^{-7}$/° C.) | 103.1 | 65.1 | 74.5 | 69.4 | 67.4 | 66.1 |
| Density (g/cm³) | 2.506 | 2.478 | 2.493 | 2.531 | 2.434 | 2.445 |

| mol % | 107WA | 107WB | 107WC | 107WD | 107WE | 107WF |
|---|---|---|---|---|---|---|
| $SiO_2$ | 68.91 | 66.92 | 66.84 | 68.71 | 68.63 | 67.85 |
| $Al_2O_3$ | 9.95 | 9.95 | 9.95 | 9.95 | 8.94 | 9.95 |
| $B_2O_3$ | 0.00 | 0.00 | 0.00 | 0.00 | 0.00 | 0.00 |
| $Li_2O$ | 6.99 | 7.94 | 6.98 | 7.86 | 7.82 | 7.82 |
| $Na_2O$ | 3.95 | 4.95 | 3.95 | 3.93 | 4.93 | 3.97 |
| $K_2O$ | 2.94 | 0.99 | 2.95 | 2.95 | 0.99 | 2.97 |
| MgO | 5.10 | 5.09 | 5.16 | 5.44 | 6.48 | 6.29 |

TABLE 2-continued

Compositions, densities, strain points, softening points, anneal points, and coefficients of thermal expansion (CTE) of selected lithium aluminosilicate glasses.

| | | | | | | |
|---|---|---|---|---|---|---|
| CaO | 2.06 | 2.06 | 2.08 | 1.05 | 2.10 | 1.05 |
| $SnO_2$ | 0.10 | 0.10 | 0.10 | 0.10 | 0.10 | 0.10 |
| $R_2O$—$Al_2O_3$ | | | | | | |
| $Li_2O/(R_2O)$ | 0.504 | 0.572 | 0.503 | 0.533 | 0.569 | 0.530 |
| Strain Pt. (° C.) | 513.9 | 521.2 | 521.3 | 503.2 | 502.8 | 504.1 |
| Anneal Pt. (° C.) | 559.4 | 563.3 | 564.5 | 548.8 | 546.3 | 548.5 |
| Softening Pt. (° C.) | 793.9 | 770.6 | 776.6 | 783.4 | 766 | 775.6 |
| CTE ($\times 10^{-7}$/° C.) | 70.7 | 68.6 | 71.2 | 71.1 | 68 | 71.7 |
| Density (g/cm$^3$) | 2.434 | 2.465 | 2.463 | 2.426 | 2.436 | 2.433 |

| mol % | 107WG | 107WH | 107WI | 107WJ | 107WK | 107WL |
|---|---|---|---|---|---|---|
| $SiO_2$ | 67.70 | 67.24 | 67.05 | 66.54 | 65.01 | 67.47 |
| $Al_2O_3$ | 8.78 | 8.63 | 8.46 | 8.32 | 7.95 | 8.57 |
| $B_2O_3$ | 0.00 | 0.00 | 0.00 | 0.00 | 0.00 | 0.00 |
| $Li_2O$ | 8.78 | 9.83 | 10.69 | 11.72 | 12.09 | 8.34 |
| $Na_2O$ | 10.89 | 10.68 | 10.46 | 10.33 | 9.87 | 10.87 |
| $K_2O$ | 0.21 | 0.17 | 0.11 | 0.06 | 0.27 | 0.72 |
| MgO | 0.83 | 0.64 | 0.41 | 0.21 | 1.04 | 1.01 |
| CaO | 1.45 | 1.08 | 0.72 | 0.35 | 1.79 | 1.63 |
| $SnO_2$ | 0.00 | 0.00 | 0.00 | 0.00 | 0.00 | 0.00 |
| $R_2O$—$Al_2O_3$ | | | | | | |
| $Li_2O/(R_2O)$ | 0.441 | 0.475 | 0.503 | 0.530 | 0.544 | 0.418 |
| Strain Pt. (° C.) | 458 | 457 | 454 | 457 | 444 | 458 |
| Anneal Pt. (° C.) | 499 | 497 | 496 | 497 | 483 | 499 |
| Softening Pt. (° C.) | 695 | 691 | 689 | 686 | 664 | 693 |
| CTE ($\times 10^{-7}$/° C.) | 87.6 | 88.2 | 89.7 | 89.3 | 92.5 | 89.4 |
| Density (g/cm$^3$) | 2.475 | 2.482 | 2.489 | 2.496 | 2.502 | 2.479 |

| mol % | 107WM | 107WN | 107WO | 107WP | 107WQ | 107WR |
|---|---|---|---|---|---|---|
| $SiO_2$ | 67.14 | 66.58 | 65.94 | 66.97 | 65.95 | 65.18 |
| $Al_2O_3$ | 8.18 | 7.77 | 7.40 | 8.56 | 8.20 | 7.83 |
| $B_2O_3$ | 0.00 | 0.00 | 0.00 | 1.37 | 2.66 | 3.92 |
| $Li_2O$ | 8.47 | 8.87 | 9.27 | 8.15 | 8.36 | 8.54 |
| $Na_2O$ | 10.76 | 10.60 | 10.55 | 10.52 | 10.06 | 9.42 |
| $K_2O$ | 1.19 | 1.63 | 2.08 | 0.61 | 0.93 | 1.24 |
| MgO | 1.02 | 1.04 | 1.02 | 1.22 | 1.40 | 1.58 |
| CaO | 1.46 | 1.31 | 1.15 | 1.41 | 1.04 | 0.69 |
| $SnO_2$ | 0.00 | 0.00 | 0.00 | 0.00 | 0.00 | 0.00 |
| $R_2O$—$Al_2O_3$ | | | | | | |
| $Li_2O/(R_2O)$ | 0.415 | 0.420 | 0.423 | 0.423 | 0.432 | 0.445 |
| Strain Pt. (° C.) | 453 | 449 | 448 | 455 | 452 | 454 |
| Anneal Pt. (° C.) | 493 | 490 | 488 | 493 | 491 | 491 |
| Softening Pt. (° C.) | 687 | 680 | 679 | 682 | 665 | 660 |
| CTE ($\times 10^{-7}$/° C.) | 93.6 | 94 | 96.1 | 87.2 | 87 | 87.4 |
| Density (g/cm$^3$) | 2.491 | 2.505 | 2.517 | 2.475 | 2.48 | 2.485 |

| mol % | 107WS | 107WT | 107WU | 107WV | 107WW | 107WX |
|---|---|---|---|---|---|---|
| $SiO_2$ | 66.97 | 67.00 | 67.11 | 67.13 | 67.08 | 67.02 |
| $Al_2O_3$ | 9.42 | 9.45 | 9.49 | 9.46 | 9.49 | 9.45 |
| $B_2O_3$ | 0.00 | 0.00 | 0.00 | 0.00 | 0.00 | 0.00 |
| $Li_2O$ | 5.95 | 5.91 | 6.80 | 5.87 | 6.85 | 5.85 |
| $Na_2O$ | 11.40 | 11.37 | 11.90 | 12.38 | 11.89 | 12.43 |
| $K_2O$ | 0.26 | 0.27 | 0.27 | 0.26 | 0.27 | 0.27 |
| MgO | 1.02 | 3.13 | 1.55 | 2.04 | 1.03 | 1.04 |
| CaO | 3.85 | 1.78 | 1.78 | 1.77 | 2.29 | 2.83 |
| $SnO_2$ | 0.10 | 0.10 | 0.10 | 0.10 | 0.10 | 0.10 |
| $R_2O$—$Al_2O_3$ | | | | | | |
| $Li_2O/(R_2O)$ | 0.338 | 0.337 | 0.358 | 0.317 | 0.360 | 0.316 |
| Strain Pt. (° C.) | 485 | 485.4 | 469.7 | 476.9 | 469.5 | 477.8 |
| Anneal Pt. (° C.) | 527.2 | 528.6 | 511.9 | 518.7 | 511.7 | 519.5 |
| Softening Pt. (° C.) | 728.3 | 739.8 | 715.7 | 726 | 712.2 | 720.8 |
| CTE ($\times 10^{-7}$/° C.) | | | | | | |
| Density (g/cm$^3$) | 2.493 | 2.48 | 2.479 | 2.481 | 2.482 | 2.488 |

| mol % | 107WY | 107WZ | 107XA | 107XB | 107XC | 107XD |
|---|---|---|---|---|---|---|
| $SiO_2$ | 68.09 | 68.08 | 67.11 | 66.13 | 65.19 | 67.16 |
| $Al_2O_3$ | 10.05 | 10.06 | 10.55 | 11.04 | 11.56 | 11.05 |
| $B_2O_3$ | 0.00 | 0.00 | 0.00 | 0.00 | 0.00 | 0.00 |
| $Li_2O$ | 7.86 | 8.78 | 7.34 | 7.83 | 8.22 | 7.24 |
| $Na_2O$ | 9.85 | 8.87 | 10.83 | 10.83 | 10.84 | 10.37 |
| $K_2O$ | 0.25 | 0.25 | 0.25 | 0.25 | 0.25 | 0.25 |
| MgO | 1.01 | 1.03 | 1.03 | 1.02 | 1.03 | 1.03 |
| CaO | 1.78 | 1.81 | 1.78 | 1.79 | 1.79 | 1.79 |

TABLE 2-continued

Compositions, densities, strain points, softening points, anneal points, and coefficients of thermal expansion (CTE) of selected lithium aluminosilicate glasses.

| | | | | | | |
|---|---|---|---|---|---|---|
| $SnO_2$ | 0.10 | 0.09 | 0.10 | 0.10 | 0.10 | 0.10 |
| $R_2O$—$Al_2O_3$ | | | | | | |
| $Li_2O/(R_2O)$ | 0.438 | 0.490 | 0.399 | 0.414 | 0.426 | 0.405 |
| Strain Pt. (° C.) | 481 | 479 | 483 | 483 | 482 | 493 |
| Anneal Pt. (° C.) | 523 | 521 | 526 | 525 | 525 | 536 |
| Softening Pt. (° C.) | 736 | 728 | 736 | 731 | 731 | 749 |
| CTE (×10$^{-7}$/° C.) | 83.2 | 82.2 | 85.2 | 84.9 | 87.3 | 81.5 |
| Density (g/cm$^3$) | 2.469 | 2.465 | 2.476 | 2.479 | 2.483 | 2.473 |

| mol % | 107XE | 107XF | 107XG | 107XH | 107XI | 107XJ |
|---|---|---|---|---|---|---|
| $SiO_2$ | 65.01 | 64.58 | 65.20 | 65.18 | 64.25 | 63.48 |
| $Al_2O_3$ | 7.26 | 7.64 | 6.98 | 6.97 | 6.96 | 6.96 |
| $B_2O_3$ | 0.00 | 0.00 | 0.00 | 0.00 | 0.00 | 0.00 |
| $Li_2O$ | 10.73 | 11.72 | 9.80 | 9.81 | 9.81 | 9.69 |
| $Na_2O$ | 9.42 | 8.46 | 10.41 | 10.42 | 10.42 | 10.39 |
| $K_2O$ | 2.48 | 2.50 | 2.50 | 2.51 | 2.46 | 2.45 |
| MgO | 0.03 | 0.03 | 0.03 | 0.03 | 1.03 | 2.02 |
| CaO | 2.06 | 2.06 | 2.07 | 2.07 | 2.05 | 2.04 |
| $SnO_2$ | 0.00 | 0.00 | 0.00 | 0.00 | 0.00 | 0.00 |
| $R_2O$—$Al_2O_3$ | | | | | | |
| $Li_2O/(R_2O)$ | 0.474 | 0.517 | 0.432 | 0.431 | 0.432 | 0.430 |
| Strain Pt. (° C.) | 451.8 | 451.7 | 441.9 | 433.9 | 446.9 | 448.8 |
| Anneal Pt. (° C.) | 489.7 | 491.1 | 480 | 470.6 | 486.5 | 487.5 |
| Softening Pt. (° C.) | 676.4 | 676.7 | 653.5 | 634 | 673.5 | 669.7 |
| CTE (×10$^{-7}$/° C.) | | | | | | |
| Density (g/cm$^3$) | 2.533 | 2.53 | 2.511 | 2.488 | 2.543 | 2.548 |

| mol % | 107XK | 107XL | 107XM | 107XN | 107XO | 107XP |
|---|---|---|---|---|---|---|
| $SiO_2$ | 65.01 | 64.73 | 66.60 | 66.58 | 65.66 | 65.04 |
| $Al_2O_3$ | 7.29 | 7.69 | 9.41 | 9.45 | 9.42 | 9.29 |
| $B_2O_3$ | 0.00 | 0.00 | 0.00 | 0.00 | 0.00 | 0.00 |
| $Li_2O$ | 10.78 | 11.68 | 6.34 | 6.28 | 6.34 | 6.22 |
| $Na_2O$ | 9.39 | 8.41 | 11.50 | 11.49 | 11.46 | 11.45 |
| $K_2O$ | 1.47 | 1.48 | 1.23 | 1.23 | 1.20 | 1.22 |
| MgO | 0.50 | 0.49 | 0.03 | 0.04 | 0.98 | 1.93 |
| CaO | 2.56 | 2.56 | 2.55 | 2.54 | 2.47 | 2.43 |
| $SnO_2$ | 0.00 | 0.00 | 0.00 | 0.00 | 0.00 | 0.00 |
| $R_2O$—$Al_2O_3$ | | | | | | |
| $Li_2O/(R_2O)$ | 0.498 | 0.542 | 0.332 | 0.331 | 0.334 | 0.329 |
| Strain Pt. (° C.) | 456.5 | 457 | 478.8 | 470 | 488.6 | 489.5 |
| Anneal Pt. (° C.) | 494.9 | 496.4 | 519.9 | 509.2 | 531.2 | 532.1 |
| Softening Pt. (° C.) | 675.4 | 677 | 714.1 | 690.4 | 740 | 737.8 |
| CTE (×10$^{-7}$/° C.) | | | | | | |
| Density (g/cm$^3$) | 2.537 | 2.533 | 2.497 | 2.548 | 2.527 | 2.533 |

| mol % | 107XQ | 107XR | 107XS | 107XT | 107XU | 107XV |
|---|---|---|---|---|---|---|
| $SiO_2$ | 67.16 | 66.15 | 65.20 | 67.09 | 66.09 | 65.07 |
| $Al_2O_3$ | 10.07 | 11.06 | 12.06 | 10.06 | 11.05 | 12.05 |
| $B_2O_3$ | 0.00 | 0.00 | 0.00 | 0.00 | 0.00 | 0.00 |
| $Li_2O$ | 7.74 | 7.71 | 7.70 | 8.81 | 9.76 | 10.73 |
| $Na_2O$ | 10.88 | 10.88 | 10.86 | 9.87 | 8.88 | 7.91 |
| $K_2O$ | 0.25 | 0.25 | 0.25 | 0.25 | 0.25 | 0.25 |
| MgO | 0.99 | 1.03 | 1.02 | 1.02 | 1.04 | 1.03 |
| CaO | 1.79 | 1.80 | 1.80 | 1.78 | 1.81 | 1.82 |
| $SnO_2$ | 0.10 | 0.10 | 0.10 | 0.10 | 0.10 | 0.10 |
| $R_2O$—$Al_2O_3$ | | | | | | |
| $Li_2O/(R_2O)$ | 0.410 | 0.409 | 0.410 | 0.465 | 0.517 | 0.568 |
| Strain Pt. (° C.) | 475 | 483 | 494 | 473 | 480 | 490 |
| Anneal Pt. (° C.) | 516 | 525 | 536 | 514 | 522 | 532 |
| Softening Pt. (° C.) | 722 | 730 | 748 | 715 | 726 | 733 |
| CTE (×10$^{-7}$/° C.) | 86.5 | 85.3 | 86.5 | 85.1 | 82.9 | 81.6 |
| Density (g/cm$^3$) | 2.476 | 2.473 | 2.48 | 2.483 | 2.474 | 2.474 |

| mol % | 107XW | 107XX | 107XY | 107XZ | 107YA | 107YB |
|---|---|---|---|---|---|---|
| $SiO_2$ | 64.13 | 65.70 | 62.52 | 57.42 | 63.87 | 61.20 |
| $Al_2O_3$ | 7.57 | 7.81 | 6.98 | 6.61 | 4.44 | 4.57 |
| $B_2O_3$ | 0.00 | 0.00 | 0.00 | 0.00 | 0.00 | 0.00 |
| $Li_2O$ | 11.36 | 9.48 | 12.12 | 18.97 | 14.62 | 17.79 |
| $Na_2O$ | 10.92 | 11.26 | 11.16 | 10.73 | 9.51 | 9.25 |
| $K_2O$ | 0.32 | 0.22 | 0.24 | 0.21 | 0.20 | 0.22 |
| MgO | 1.70 | 1.56 | 2.21 | 1.80 | 2.01 | 2.03 |
| CaO | 2.40 | 2.28 | 2.99 | 2.80 | 3.46 | 3.39 |
| $SnO_2$ | 0.10 | 0.10 | 0.10 | 0.10 | 0.10 | 0.10 |

TABLE 2-continued

Compositions, densities, strain points, softening points, anneal points, and coefficients of thermal expansion (CTE) of selected lithium aluminosilicate glasses.

| $R_2O-Al_2O_3$ | | | | | | |
|---|---|---|---|---|---|---|
| $Li_2O/(R_2O)$ | 0.503 | 0.452 | 0.516 | 0.634 | 0.601 | 0.653 |
| Strain Pt. (° C.) | 439 | 450 | 432 | 406 | 420 | 407 |
| Anneal Pt. (° C.) | 476 | 490 | 469 | 438 | 455 | 441 |
| Softening Pt. (° C.) | 645 | 673 | 629 | 570 | 603 | 581 |
| CTE ($\times 10^{-7}$/° C.) | 108.7 | 104.3 | 114.1 | 101.7 | 95.1 | 95.9 |
| Density (g/cm$^3$) | 2.508 | 2.503 | 2.524 | 2.518 | 2.519 | 2.515 |

| mol % | 107YC | 107YD | 107YE | 107YF | 107YG | 107YH |
|---|---|---|---|---|---|---|
| $SiO_2$ | 64.66 | 65.15 | 65.25 | 65.22 | 65.27 | 65.26 |
| $Al2O_3$ | 10.67 | 11.20 | 10.68 | 9.77 | 10.68 | 11.19 |
| $B_2O_3$ | 0.00 | 0.00 | 0.00 | 0.00 | 0.00 | 0.00 |
| $Li_2O$ | 8.27 | 7.96 | 7.93 | 8.38 | 7.91 | 8.34 |
| $Na_2O$ | 11.71 | 11.22 | 11.18 | 11.88 | 11.20 | 10.73 |
| $K_2O$ | 0.27 | 0.26 | 0.26 | 0.28 | 0.26 | 0.26 |
| MgO | 1.27 | 1.21 | 1.21 | 1.28 | 1.69 | 1.21 |
| CaO | 1.95 | 1.88 | 1.86 | 1.98 | 1.86 | 1.87 |
| $SnO_2$ | 0.10 | 0.10 | 0.10 | 0.10 | 0.10 | 0.10 |
| $R_2O-Al_2O_3$ | | | | | | |
| $Li_2O/(R_2O)$ | 0.408 | 0.409 | 0.409 | 0.408 | 0.408 | 0.432 |
| Strain Pt. (° C.) | 471.4 | 479.4 | 483.9 | 462.3 | 476.3 | 480.4 |
| Anneal Pt. (° C.) | 512.2 | 521.6 | 526.1 | 502 | 518.4 | 521.8 |
| Softening Pt. (° C.) | | | | | | |
| CTE ($\times 10^{-7}$/° C.) | 89.6 | 87.3 | 89.7 | 90.4 | 87.6 | 85.8 |
| Density (g/cm$^3$) | 2.491 | 2.485 | 2.498 | 2.49 | 2.487 | 2.484 |

| mol % | 107YL | 107YN | 107YP | 107YQ | 107YR | 107YS |
|---|---|---|---|---|---|---|
| $SiO_2$ | 65.99 | 66.16 | 65.12 | 65.15 | 65.20 | 65.13 |
| $Al2O_3$ | 9.52 | 9.54 | 10.62 | 10.69 | 10.69 | 10.69 |
| $B_2O_3$ | 0.00 | 0.00 | 0.00 | 0.00 | 0.00 | 0.00 |
| $Li_2O$ | 6.49 | 6.49 | 6.15 | 9.94 | 7.89 | 7.98 |
| $Na_2O$ | 11.37 | 11.38 | 13.18 | 9.25 | 10.25 | 9.25 |
| $K_2O$ | 1.24 | 1.23 | 0.26 | 0.26 | 1.25 | 2.25 |
| MgO | 0.26 | 0.25 | 1.70 | 1.70 | 1.72 | 1.70 |
| CaO | 2.49 | 2.51 | 1.85 | 1.88 | 1.87 | 1.87 |
| $SnO_2$ | 0.09 | 0.09 | 0.10 | 0.10 | 0.10 | 0.10 |
| $R_2O-Al_2O_3$ | | | | | | |
| $Li_2O/(R_2O)$ | 0.340 | 0.340 | 0.314 | 0.511 | 0.407 | 0.410 |
| Strain Pt. (° C.) | | | 483 | 473 | 474 | 473 |
| Anneal Pt. (° C.) | | | 525 | 515 | 517 | 515 |
| Softening Pt. (° C.) | | | 0.314 | 0.511 | 0.407 | 0.410 |
| CTE ($\times 10^{-7}$/° C.) | | | | | | |
| Density (g/cm$^3$) | | | 483 | 473 | 474 | 473 |

| mol % | 107YT | 107YU | 107YV | 107AAC | 107AAD | 107AAE |
|---|---|---|---|---|---|---|
| $SiO_2$ | 64.10 | 62.85 | 65.27 | 67.60 | 67.52 | 67.51 |
| $Al2O_3$ | 10.52 | 10.33 | 7.93 | 8.38 | 8.87 | 9.35 |
| $B_2O_3$ | 1.89 | 3.70 | 0.00 | 0.00 | 0.00 | 0.00 |
| $Li_2O$ | 7.65 | 7.56 | 8.86 | 8.03 | 8.09 | 8.16 |
| $Na_2O$ | 10.96 | 10.73 | 10.33 | 10.72 | 10.23 | 9.71 |
| $K_2O$ | 0.25 | 0.24 | 1.80 | 0.95 | 0.95 | 0.96 |
| MgO | 1.68 | 1.70 | 0.18 | 1.05 | 1.06 | 1.04 |
| CaO | 1.84 | 1.80 | 2.73 | 1.59 | 1.60 | 1.59 |
| $SnO_2$ | 0.09 | 0.09 | 0.09 | 0.10 | 0.09 | 0.10 |
| $R_2O-Al_2O_3$ | | | | | | |
| $Li_2O/(R_2O)$ | 0.406 | 0.408 | 0.422 | 0.408 | 0.420 | 0.434 |
| Strain Pt. (° C.) | 464 | 466 | | | | |
| Anneal Pt. (° C.) | 504 | 503 | | | | |
| Softening Pt. (° C.) | | | | | | |
| CTE ($\times 10^{-7}$/° C.) | | | | | | |
| Density (g/cm$^3$) | 2.485 | 2.482 | | 2.489 | 2.487 | 2.485 |

| mol % | 107AAF | 107AAG | 107AAH | 107AAK | 107AAL | 107AAM |
|---|---|---|---|---|---|---|
| $SiO_2$ | 67.45 | 67.08 | 67.52 | 67.73 | 67.55 | 67.40 |
| $Al2O_3$ | 8.85 | 8.87 | 8.87 | 8.69 | 8.63 | 8.64 |
| $B_2O_3$ | 0.00 | 0.00 | 0.00 | 0.00 | 0.00 | 0.00 |
| $Li_2O$ | 8.18 | 8.06 | 8.59 | 9.89 | 10.04 | 10.20 |
| $Na_2O$ | 9.23 | 10.20 | 9.71 | 10.18 | 10.22 | 10.22 |
| $K_2O$ | 1.96 | 0.96 | 0.96 | 0.31 | 0.30 | 0.30 |
| MgO | 1.04 | 1.55 | 1.05 | 0.42 | 0.43 | 0.42 |
| CaO | 1.60 | 1.60 | 1.60 | 0.72 | 0.73 | 0.73 |
| $SnO_2$ | 0.10 | 0.09 | 0.09 | 0.00 | 0.00 | 0.00 |
| $R_2O-Al_2O_3$ | | | | | | |

TABLE 2-continued

Compositions, densities, strain points, softening points, anneal points, and coefficients of thermal expansion (CTE) of selected lithium aluminosilicate glasses.

| | | | | | | |
|---|---|---|---|---|---|---|
| $Li_2O/(R_2O)$ | 0.422 | 0.419 | 0.446 | 0.485 | 0.488 | 0.492 |
| Strain Pt. (° C.) | | | | | | |
| Anneal Pt. (° C.) | | | | | | |
| Softening Pt. (° C.) | | | | | | |
| CTE (×10$^{-7}$/° C.) | | | | | | |
| Density (g/cm$^3$) | 2.486 | 2.49 | 2.485 | | | |

| mol % | 107AAN | 716HZE | 716HZJ | 716HZQ | 716IBA | 716IBS |
|---|---|---|---|---|---|---|
| $SiO_2$ | 65.67 | 65.46 | 65.38 | 65.45 | 66.14 | 65.87 |
| $Al2O_3$ | 10.33 | 9.40 | 9.39 | 9.39 | 10.30 | 10.33 |
| $B_2O_3$ | 0.00 | 0.00 | 0.00 | 0.00 | 0.00 | 0.00 |
| $Li_2O$ | 7.85 | 6.17 | 6.13 | 6.12 | 7.68 | 7.71 |
| $Na_2O$ | 11.09 | 11.09 | 11.12 | 11.01 | 10.81 | 11.01 |
| $K_2O$ | 0.76 | 1.16 | 1.20 | 1.17 | 0.71 | 0.71 |
| MgO | 1.39 | 2.02 | 1.99 | 1.98 | 1.41 | 1.42 |
| CaO | 1.84 | 2.40 | 2.38 | 2.37 | 1.81 | 1.83 |
| $SnO_2$ | 0.00 | 0.08 | 0.05 | 0.05 | 0.05 | 0.03 |
| $R_2O$—$Al_2O_3$ | | | | | | |
| $Li_2O/(R_2O)$ | 0.398 | 0.335 | 0.332 | 0.334 | 0.400 | 0.397 |
| Strain Pt. (° C.) | 470 | 483.2 | 483.1 | 487.4 | 466.5 | 461.2 |
| Anneal Pt. (° C.) | 512 | 524.9 | 526.0 | 529.3 | 506.8 | 502.7 |
| Softening Pt. (° C.) | | | 735.4 | 742.3 | 711 | 703.3 |
| CTE (×10$^{-7}$/° C.) | | 87.4 | 88.7 | | 89.9 | 89.6 |
| Density (g/cm$^3$) | 2.446 | | 2.532 | 2.534 | 2.485 | |

| mol % | 716IBT | 716IBU | 196HLP | 196HLQ | 196HLR | 196HLS |
|---|---|---|---|---|---|---|
| $SiO_2$ | 65.92 | 65.96 | 60.22 | 60.03 | 59.88 | 59.96 |
| $Al_2O_3$ | 10.32 | 10.32 | 16.94 | 14.90 | 16.84 | 16.85 |
| $B_2O_3$ | 0.00 | 0.00 | 5.83 | 5.83 | 5.95 | 5.92 |
| $Li_2O$ | 7.72 | 7.72 | 0.00 | 0.00 | 4.98 | 7.00 |
| $Na_2O$ | 10.99 | 10.94 | 15.85 | 13.89 | 11.13 | 9.07 |
| $K_2O$ | 0.70 | 0.70 | 1.00 | 1.00 | 1.07 | 1.06 |
| MgO | 1.42 | 1.41 | 0.02 | 4.20 | 0.01 | 0.02 |
| CaO | 1.81 | 1.81 | 0.02 | 0.05 | 0.02 | 0.02 |
| $SnO_2$ | 0.03 | 0.03 | 0.08 | 0.08 | 0.08 | 0.08 |
| $R_2O$—$Al_2O_3$ | | | | | | |
| $Li_2O/(R_2O)$ | 0.398 | 0.399 | | | 0.290 | 0.409 |
| Strain Pt. (° C.) | 461.6 | 461.3 | 578.8 | 559.1 | 526.2 | 520.8 |
| Anneal Pt. (° C.) | 501.6 | 502.6 | 633.6 | 608.6 | 577.3 | 568.4 |
| Softening Pt. (° C.) | 702.5 | 703.1 | 906 | 858 | 820 | 814 |
| CTE (×10$^{-7}$/° C.) | 89 | 90.5 | 89.6 | 81.7 | 85.1 | 78.7 |
| Density (g/cm$^3$) | | | 2.406 | 2.421 | 2.401 | 2.395 |

| mol % | 196HLT | 196HLU | 196HQB | 196HQC | 196HQD | 196HQE |
|---|---|---|---|---|---|---|
| $SiO_2$ | 59.87 | 59.98 | 60.432 | 60.351 | 60.627 | 60.462 |
| $Al_2O_3$ | 15.89 | 14.88 | 15.212 | 16.250 | 16.612 | 15.760 |
| $B_2O_3$ | 5.88 | 5.84 | 5.949 | 5.951 | 5.939 | 5.928 |
| $Li_2O$ | 6.49 | 5.98 | 5.860 | 5.884 | 6.080 | 6.995 |
| $Na_2O$ | 8.55 | 7.94 | 11.391 | 10.421 | 9.604 | 9.665 |
| $K_2O$ | 1.05 | 1.02 | 0.945 | 0.935 | 0.925 | 0.975 |
| MgO | 2.13 | 4.20 | 0.045 | 0.046 | 0.046 | 0.046 |
| CaO | 0.03 | 0.05 | 0.042 | 0.042 | 0.045 | 0.046 |
| $SnO_2$ | 0.08 | 0.08 | 0.081 | 0.081 | 0.081 | 0.082 |
| $R_2O$—$Al_2O_3$ | 0.19 | 0.06 | 2.98 | 0.99 | 0.00 | 1.87 |
| $Li_2O/(R_2O)$ | 0.403 | 0.400 | 0.322 | 0.341 | 0.366 | 0.397 |
| Strain Pt. (° C.) | 509.5 | 511.6 | 478.6 | 486.7 | 499.3 | 485.8 |
| Anneal Pt. (° C.) | 555.7 | 557.0 | 519.0 | 530.1 | 544.9 | 528.1 |
| Softening Pt. (° C.) | 784 | 784 | 720 | 775 | 815 | 738 |
| CTE (×10$^{-7}$/° C.) | 76 | 71 | 86.7 | 82.7 | 80.9 | 81.5 |
| Density (g/cm$^3$) | 2.406 | 2.412 | 2.422 | 2.407 | 2.398 | 2.41 |

| mol % | 196HQF | 196HQG | 196HQH | 196HQI | 196HQJ | 196HQK |
|---|---|---|---|---|---|---|
| $SiO_2$ | 60.462 | 60.393 | 60.136 | 59.979 | 59.867 | 60.099 |
| $Al_2O_3$ | 14.902 | 14.918 | 16.000 | 16.066 | 14.972 | 17.064 |
| $B_2O_3$ | 5.948 | 5.975 | 6.079 | 6.026 | 8.071 | 4.087 |
| $Li_2O$ | 7.350 | 5.828 | 5.851 | 5.969 | 5.724 | 6.228 |
| $Na_2O$ | 9.663 | 9.985 | 9.753 | 11.712 | 10.175 | 11.295 |
| $K_2O$ | 1.450 | 2.689 | 1.964 | 0.028 | 0.983 | 0.996 |
| MgO | 0.051 | 0.047 | 0.045 | 0.050 | 0.041 | 0.052 |
| CaO | 0.048 | 0.043 | 0.045 | 0.045 | 0.043 | 0.048 |
| $SnO_2$ | 0.084 | 0.083 | 0.083 | 0.083 | 0.082 | 0.083 |
| $R_2O$—$Al_2O_3$ | 3.56 | 3.58 | 1.57 | 1.64 | 1.91 | 1.46 |
| $Li_2O/(R_2O)$ | 0.398 | 0.315 | 0.333 | 0.337 | 0.339 | 0.336 |

TABLE 2-continued

Compositions, densities, strain points, softening points, anneal points, and coefficients of thermal expansion (CTE) of selected lithium aluminosilicate glasses.

| | | | | | | |
|---|---|---|---|---|---|---|
| Strain Pt. (° C.) | 470.3 | 471.0 | 485.5 | 491.9 | 481.0 | 500.5 |
| Anneal Pt. (° C.) | 510.7 | 510.9 | 529.4 | 536.3 | 523.6 | 546.1 |
| Softening Pt. (° C.) | 701 | 705 | 759 | 756 | 730 | 778 |
| CTE (×10$^{-7}$/° C.) | 85 | 86.6 | 84.1 | 82.2 | 82.1 | 88 |
| Density (g/cm$^3$) | 2.42 | 2.425 | 2.411 | 2.413 | 2.397 | 2.428 |

| mol % | 196HQL | 196HQM | 196HVQ | 196HVR | 196HVS | 196HVT |
|---|---|---|---|---|---|---|
| SiO$_2$ | 60.140 | 60.048 | 60.452 | 60.473 | 60.373 | 62.560 |
| Al$_2$O$_3$ | 16.090 | 15.056 | 16.842 | 16.335 | 15.823 | 15.855 |
| B$_2$O$_3$ | 6.049 | 6.106 | 6.039 | 6.023 | 6.027 | 5.918 |
| Li$_2$O | 5.803 | 5.815 | 6.683 | 6.492 | 6.303 | 6.325 |
| Na$_2$O | 9.716 | 9.746 | 8.751 | 8.474 | 8.264 | 8.148 |
| K$_2$O | 0.982 | 0.991 | 0.995 | 0.992 | 0.994 | 0.973 |
| MgO | 1.043 | 2.053 | 0.055 | 1.027 | 2.029 | 0.047 |
| CaO | 0.051 | 0.059 | 0.054 | 0.058 | 0.061 | 0.049 |
| SnO$_2$ | 0.082 | 0.081 | 0.081 | 0.079 | 0.080 | 0.081 |
| R$_2$O—Al$_2$O$_3$ | 0.41 | 1.50 | −0.41 | −0.38 | −0.26 | −0.41 |
| Li$_2$O/(R$_2$O) | 0.352 | 0.351 | 0.407 | 0.407 | 0.405 | 0.409 |
| Strain Pt. (° C.) | 500.8 | 485.7 | | | | |
| Anneal Pt. (° C.) | 547.1 | 529.3 | | | | |
| Softening Pt. (° C.) | 779 | 746 | | | | |
| CTE (×10$^{-7}$/° C.) | 81 | 79.3 | | | | |
| Density (g/cm$^3$) | 2.407 | 2.416 | 2.395 | 2.401 | 2.405 | 2.385 |

| mol % | 196HVU | 196HW | 196HVW | 196HVX | 196HVY | 196HVZ |
|---|---|---|---|---|---|---|
| SiO$_2$ | 64.405 | 62.473 | 64.869 | 64.742 | 64.860 | 59.773 |
| Al$_2$O$_3$ | 14.859 | 15.816 | 13.272 | 13.276 | 13.287 | 14.728 |
| B$_2$O$_3$ | 5.974 | 5.973 | 5.196 | 5.165 | 5.151 | 5.827 |
| Li$_2$O | 5.825 | 6.272 | 4.659 | 5.790 | 6.667 | 5.666 |
| Na$_2$O | 7.739 | 9.220 | 8.675 | 7.682 | 6.689 | 10.509 |
| K$_2$O | 0.982 | 0.030 | 0.026 | 0.028 | 0.031 | 0.028 |
| MgO | 0.049 | 0.047 | 1.509 | 1.510 | 1.499 | 1.970 |
| CaO | 0.045 | 0.049 | 0.052 | 0.055 | 0.058 | 0.058 |
| SnO$_2$ | 0.080 | 0.079 | 0.006 | 0.009 | 0.008 | 0.005 |
| R$_2$O—Al$_2$O$_3$ | −0.31 | −0.29 | 0.09 | 0.22 | 0.10 | −0.31 |
| Li$_2$O/(R$_2$O) | 0.400 | 0.404 | 0.349 | 0.429 | 0.498 | 0.400 |
| Strain Pt. (° C.) | | | | | | |
| Anneal Pt. (° C.) | | | | | | |
| Softening Pt. (° C.) | | | | | | |
| CTE (×10$^{-7}$/° C.) | | | | | | |
| Density (g/cm$^3$) | 2.375 | 2.386 | 2.408 | 2.406 | 2.403 | 2.375 |

| mol % | 196HVZ | 196HWA | 196HWB | 196HXW | 196HXX | 196HXY |
|---|---|---|---|---|---|---|
| SiO$_2$ | 59.773 | 59.271 | 58.890 | 60.00 | 60.00 | 60.00 |
| Al$_2$O$_3$ | 14.728 | 14.635 | 14.544 | 16.75 | 16.25 | 15.75 |
| B$_2$O$_3$ | 5.827 | 5.826 | 5.797 | 6.00 | 6.00 | 6.00 |
| Li$_2$O | 5.666 | 5.626 | 5.587 | 6.25 | 6.00 | 5.75 |
| Na$_2$O | 10.509 | 10.436 | 10.325 | 10.00 | 9.75 | 9.50 |
| K$_2$O | 0.028 | 0.028 | 0.028 | 1.00 | 1.00 | 1.00 |
| MgO | 1.970 | 1.988 | 1.960 | 0.00 | 1.00 | 2.00 |
| CaO | 0.058 | 0.061 | 0.061 | | | |
| SnO$_2$ | 0.005 | 0.005 | 0.005 | 0.08 | 0.08 | 0.08 |
| R$_2$O—Al$_2$O$_3$ | 1.47 | 1.46 | 1.40 | 0.50 | 0.50 | 0.50 |
| Li$_2$O/(R$_2$O) | 0.350 | 0.350 | 0.351 | 0.362 | 0.358 | 0.354 |
| Strain Pt. (° C.) | | | | 496 | | |
| Anneal Pt. (° C.) | | | | 541 | | |
| Softening Pt. (° C.) | | | | 796 | | |
| CTE (×10$^{-7}$/° C.) | | | | 81.1 | | |
| Density (g/cm$^3$) | 2.435 | 2.446 | 2.458 | 2.401 | | |

| mol % | 196HXZ | 196HYA | 196HYB |
|---|---|---|---|
| SiO$_2$ | 60.00 | 60.00 | 62.00 |
| Al$_2$O$_3$ | 16.25 | 16.75 | 16.75 |
| B$_2$O$_3$ | 6.00 | 6.00 | 4.00 |
| Li$_2$O | 5.50 | 6.50 | 6.25 |
| Na$_2$O | 9.25 | 10.75 | 10.00 |
| K$_2$O | 1.00 | 0.00 | 1.00 |
| MgO | 2.00 | 0.00 | 0.00 |
| CaO | | | |
| SnO$_2$ | 0.08 | 0.08 | 0.08 |
| R$_2$O—Al$_2$O$_3$ | −0.50 | 0.50 | 0.50 |
| Li$_2$O/(R$_2$O) | 0.349 | 0.377 | 0.362 |
| Strain Pt. (° C.) | | | |

TABLE 2-continued

Compositions, densities, strain points, softening points, anneal points, and coefficients of thermal expansion (CTE) of selected lithium aluminosilicate glasses.

| | | | |
|---|---|---|---|
| Anneal Pt. (° C.) | | | |
| Softening Pt. (° C.) | | | |
| CTE (×10$^{-7}$/° C.) | | | |
| Density (g/cm$^3$) | 2.435 | 2.446 | 2.458 |

The lithium aluminosilicate glasses described herein, in some embodiments, may have an elastic modulus of at least about 68 gigaPascals (GPa).

In addition to exemplary compositions of lithium silicate glasses, physical properties, including strain, anneal, and softening points; CTE; and density of these example glasses are listed in Table 2. The strain point was determined using the beam bending viscosity method of ASTM C598-93 (2013). The annealing point was determined using the beam bending viscosity method of ASTM C598-93(2013). The softening point was determined using the parallel plate viscosity method of ASTM C1351M-96(2012). The linear coefficient of thermal expansion (CTE) over the temperature range 0-300° C. is expressed in terms of ppm/K and was determined using a push-rod dilatometer in accordance with ASTM E228-11. The density was determined using the buoyancy method of ASTM C693-93(2013).

In some embodiments, the lithium aluminosilicate glasses described herein have a liquidus viscosity of greater than about 10,000 Poise (P) and, in certain embodiments, greater than 100,000 P. In some embodiments, these glasses are compatible with fusion processes, such as fusion draw processes or the like, and compatible with zircon hardware used in forming. However, in some embodiments (e.g., example 3 in Table 1) these glasses have low liquidus viscosities and are therefore not fusion-formable. In these instances, the glass may be formed by slot draw, float, rolling, and other sheet-forming processes known in the art.

The glasses described herein may be formed into articles such as, but not limited to, flat plates and three dimensional articles having thicknesses ranging from about 0.2 mm up to about 2 mm and, in some embodiments, from about 0.5 mm to about 1.5 mm.

The viscosity and mechanical performance are influenced by glass compositions. In the glass compositions described herein, $SiO_2$ serves as the primary glass-forming oxide and can serve to stabilize the networking structure. The concentration of $SiO_2$ should be sufficiently high in order to provide the glass with sufficiently high chemical durability suitable for consumer applications. However, the melting temperature (200 poise temperature) of pure $SiO_2$ or high content $SiO_2$ glasses is too high to allow the glass to be processed by certain methods. Furthermore, the presence of $SiO_2$ decreases the compressive stress created by ion exchange. In some embodiments, the lithium aluminosilicate glasses described herein comprise from about 55 mol % to about 75 mol % $SiO_2$, such as from about 57 mol % to about 73 mol % $SiO_2$; from about 59 mol % to about 71 mol % $SiO_2$; from about 61 mol % to about 69 mol % $SiO_2$; from about 63 mol % to about 67 mol % $SiO_2$; from about 55 mol % to about 60 mol % $SiO_2$; from about 58 mol % to about 69 mol % $SiO_2$; or any sub-ranges contained therein.

$Al_2O_3$ may also serve as a glass former in these glasses. Like $SiO_2$, alumina generally increases the viscosity of the melt, and an increase in $Al_2O_3$ relative to the alkalis or alkaline earths generally results in improved durability. The structural role of the aluminum ions depends on the glass composition. When the concentration of alkali metal oxides ($R_2O$) is close to or greater than the concentration of alumina ($Al_2O_3$), all aluminum is found in tetrahedral coordination with the alkali metal ions acting as charge-balancers. This is the case for all of the glasses described herein. In general, $Al_2O_3$ also plays an important role in ion exchangeable glasses, as it enables a strong network backbone (i.e., high strain point) while allowing for the relatively fast diffusivity of alkali ions. However, high $Al_2O_3$ concentrations generally lower the liquidus viscosity and thus $Al_2O_3$ concentration needs to be controlled in a reasonable range. In some embodiments, the glasses described herein comprise from about 9 mol % to about 18 mol % $Al_2O_3$, such as from about 10 mol % to about 18 mol % $Al_2O_3$; from about 12 mol % to about 16 mol % $Al_2O_3$; from about 12 mol % to about 15 mol % $Al_2O_3$; from about 9 mol % to about 17 mol % $Al_2O_3$; or any sub-ranges contained therein.

Alkali oxides ($Li_2O$, $Na_2O$, $K_2O$, $Rb_2O$, and $Cs_2O$) serve as aids in achieving low melting temperature and low liquidus temperatures. On the other hand, the addition of alkali oxide dramatically increases the coefficient of thermal expansion (CTE) and lowers the chemical durability. Most importantly, to perform ion exchange, the presence of at least one small alkali oxide such as $Li_2O$ and $Na_2O$ is required to exchange with larger alkali ions (e.g., $K^+$) from an ion exchange medium, such as a salt bath. Three types of ion exchange can generally be carried out: $Na^+$-for-$Li^+$ exchange, which results in a deep depth of layer but low compressive stress; $K^+$-for-$Li^+$ exchange, which results in a small depth of layer but a relatively large compressive stress; and $K^+$-for-$Na^+$ exchange, which results in intermediate depth of layer and compressive stress. Because compressive stress is proportional to the number of alkali ions that are exchanged out of the glass, a sufficiently high concentration of the at least one small alkali oxide is needed to produce a large compressive stress in the glass. In some embodiments, the glasses described herein comprise from about 2.5 mol % to about 20 mol % $Li_2O$, such as from about 3 mol % to about 20 mol % $Li_2O$; from about 4 mol % to about 18 mol % $Li_2O$; from about 5 mol % to about 16 mol % $Li_2O$; from about 6 mol % to about 14 mol % $Li_2O$; from about 5 mol % to about 14 mol % $Li_2O$; from about 7 mol % to about 10 mol % $Li_2O$; from about 2.5 mol % to about 12 mol % $Li_2O$; from about 4 mol % to about 10 mol % $Li_2O$; or any sub-ranges contained therein. In some embodiments, these glasses comprise from 0 mol % to about 14 mol % $Na_2O$; such as from 0 mol % to about 5 mol % $Na_2O$; from about 0.2 mol % to about 12 mol % $Na_2O$; from about 4 mol % to about 14 mol % $Na_2O$; from 0.2 mol % to about 14 mol % $Na_2O$; or any sub-ranges contained therein. The glasses described herein, in some embodiments, may comprise from 0 mol % to about 4 mol % $K_2O$, such as from 0 mol % to about 2.5 mol % $K_2O$; from 0 mol % to about 1 mol % $K_2O$; or any sub-ranges contained therein.

To achieve a high liquidus viscosity and thus make formation by down-draw techniques, particularly by the fusion draw method, $Li_2O$ glass should account for less than half of the total alkali oxide content on a molar basis. When $Li_2O/(Li_2O+Na_2O+K_2O+Rb_2O+Cs_2O)$ exceeds 0.5, the spodumene liquidus increases and the glasses are no longer compatible with the fusion technique. Thus, in some embodiments, $Li_2O/(Li_2O+Na_2O+K_2O+Rb_2O+Cs_2O)$ is in a range from about 0.1 to about 0.5; such as $0.1 \leq Li_2O/(Li_2O+Na_2O+K_2O+Rb_2O+Cs_2O) \leq 0.4$, $0.2 \leq Li_2O/(Li_2O+Na_2O+K_2O+Rb_2O+Cs_2O) \leq 0.4$, or any sub-ranges contained therein. To achieve high compressive stress at depth after ion exchange, however, it is desirable to maximize the $Li_2O$ content. To achieve a compressive stress of greater than 100 MPa at depths greater than 40 um, the $Li_2O$ content should therefore be greater than about 4 mol % and, in some embodiments, preferably greater than about 5 mol %, and should be less than about 10 mole %.

The presence of $K_2O$ increases the rate of $K^+$ for $Na^+$ ion exchange but drastically decreases the compressive stress after ion exchange. In some embodiments, the glass should comprise less than about 2.5 mol % $K_2O$ and, in certain embodiments, the $K_2O$ concentration should not exceed 1 mole %.

Divalent cation oxides (such as alkaline earth oxides and zinc oxide) also improve the melting behavior of the glass. With respect to ion exchange performance, however, the presence of divalent cations acts to decrease alkali cation mobility. This negative effect on ion exchange performance is especially pronounced with the larger divalent cations. Furthermore, the smaller divalent cation oxides generally help enhance the compressive stress more than the larger divalent cation oxides. Hence, MgO offers several advantages with respect to improved stress relaxation while minimizing the adverse effects on alkali diffusivity. However, when the contents of MgO are high, the glasses are prone to form forsterite ($Mg_2SiO_4$), which causes the liquidus temperature to rise very steeply as MgO concentration rises above a certain level. In some embodiments, MgO is the only divalent cation oxide present in the glass. In other embodiments, the glasses described herein may contain at least one of MgO and ZnO. Accordingly, these glasses, in some embodiments, may comprise from 0 mol % to about 8 mol % MgO, such as from 0 mol % to about 6 mol % MgO; from 0 mol % to about 5 mol % MgO; from 0 mol % to about 3 mol % MgO; from 0 mol % to about 1 mol % MgO; or any sub-ranges contained therein. In some embodiments, the glass may comprise from 0 mol % to about 4 mol % ZnO, such as from 0 mol % to about 3 mol % ZnO; from 0 mol % to about 2 mol % ZnO; from 0 mol % to about 1 mol % ZnO, or any sub-ranges contained therein.

When boron is not charge balanced by alkali oxides or divalent cation oxides, it will be in a trigonal coordination state, and thus open up the glass structure. The network around the trigonally coordinated boron is not as rigid as those surrounding tetrahedrally coordinated boron; the bonds are "floppy (i.e. elastic, flexible, or capable of bending or stretching)" and therefore allow the glasses to tolerate some deformation before crack formation. Furthermore, boron decreases the melting viscosity and effectively helps suppress the zircon breakdown viscosity of the glass. In some embodiments, the glasses described herein contain from 0 mol % to about 20 mol % $B_2O_3$, such as from about 2.5 mol % to about 20 mol % $B_2O_3$; from about 3 mol % to about 18 mol % $B_2O_3$; from about 3.5 mol % to about 16 mol % $B_2O_3$; from about 4 mol % to about 16 mol % $B_2O_3$; from about 4.5 mol % to about 14 mol % $B_2O_3$; from about 5 mol % to about 12 mol % $B_2O_3$; from about 2.5 mol % to about 7.5 mol % $B_2O_3$; from about 5 mol % to about 7 mol % $B_2O_3$; from about 3.5 mol % to about 9.5 mol % $B_2O_3$; from about 5 mol % to about 9 mol % $B_2O_3$; or any sub-ranges contained therein.

$P_2O_5$ improves damage resistance and does not impede ion exchange. In some embodiments, the addition of phosphorous to the glass creates a structure in which silica ($SiO_2$ in the glass) is replaced by aluminum phosphate ($AlPO_4$), which consists of tetrahedrally coordinated aluminum and phosphorus and/or boron phosphate ($BPO_4$), which consists of tetrahedrally coordinated boron and phosphorus. In some embodiments, the glass comprises from 0 to about 4 mol % $P_2O_5$, such as from 0 mol % to about 3 mol % $P_2O_5$; from 0 mol % to about 2.5 mol % $P_2O_5$; from 0 mol % to about 1 mol % $P_2O_5$; or any sub-ranges contained therein.

$TiO_2$ serves as a nucleation agent to produce bulk nucleation if a glass-ceramic article is desired. If the concentration of $TiO_2$ is too low, the precursor glass does not crystallize. If the concentration is too high, the devitrification, upon cooling during precursor glass forming, can be difficult to control. In some embodiments, the glasses described herein may comprise from 0 mol % to about 5 mol % $TiO_2$, such as from 0 mol % to about 4 mol % $TiO_2$, from 0 mol % to about 3 mol % $TiO_2$, from 0 mol % to about 2 mol % $TiO_2$, from 0 mol % to about 1 mol % $TiO_2$, or any sub-ranges contained therein.

In some embodiments, the glasses described herein may further include at least one fining agent such as, but not limited to, $SnO_2$, $As_2O_3$, $Sb_2O_3$, and the like. Due to environmental and toxicity concerns, $As_2O_3$ and $Sb_2O_3$ are typically not included in glasses. Accordingly, the glasses described herein are typically free of $As_2O_3$ and $Sb_2O_3$ and, in some embodiments, these glasses may comprise from about 0.05 mol % to about 0.5 mol % $SnO_2$.

Rare earth oxides may increase the hardness and elastic modulus of a glass, but they hamper ion exchange, increase the density and cost of the glass, and many impart color to the glass. It is therefore desirable to limit the total rare earth oxide content to less than 0.1 mol %.

In some aspects, the lithium aluminosilicate glasses described herein are strengthened by forming a compressive layer on the surfaces of the glass. In certain embodiments, these glasses are chemically strengthened, and in particular embodiments, are chemically strengthened by ion exchange.

Ion exchange is a process in which smaller cations in the glass are exchanged for larger cations that are present in an ion exchange medium such as a molten salt bath or a paste. In a particular embodiment, ion exchange is carried out by immersing the glass in a molten salt bath substantially comprising a salt of the larger cation. The ion exchange bath may also comprise salts of the smaller cations that are present in the glass. As used herein, the term "substantially comprising" means that other components may be present in the molten salt bath. Such components may include, but are not limited to, compounds that act to reduce attack of the bath vessel or the glass article by the molten salt. Such additional components may include, but are not limited to, selected components of the glass, such as silicic acid, alumina in gel form, silica in gel form, or the like.

A cross-sectional schematic view of an ion exchanged glass article is shown in FIG. 1. Glass article 100 has a thickness t, first surface 110, and second surface 112. Glass article 100, in some embodiments, has a thickness t of up to about 1 mm. While the embodiment shown in FIG. 1 depicts glass article 100 as a flat planar sheet or plate, glass article 100 may have other configurations, such as three dimensional shapes or non-planar configurations. Glass article 100 has a first compressive layer 120 extending from first surface 110 to a depth of layer (DOL) $d_1$ into the bulk of the glass article 100. In the embodiment shown in FIG. 1, glass article 100 also has a second compressive layer 122 extending from second surface 112 to a second depth of layer $d_2$. First and second compressive layers 120, 122 are each under a compressive stress CS. In some embodiments, first and second compressive layers 120, 122 each have a maximum compressive stress at the first and second surfaces 110, 112, respectively. Glass article also has a central region 130 that extends from $d_1$ to $d_2$. Central region 130 is under a tensile stress or central tension (CT), which balances or counteracts the compressive stresses of layers 120 and 122. The depths of layer $d_1$, $d_2$ of first and second compressive layers 120, 122 protects the glass article 100 from the propagation of flaws introduced by sharp impact to first and second surfaces 110, 112 of glass article 100, while the compressive stress of at least about 900 MPa minimizes the likelihood of a flaw penetrating through the depth $d_1$, $d_2$ of first and second compressive layers 120, 122.

When ion exchanged, the lithium aluminosilicate glasses described herein typically exhibit, relative to their sodium analogs, deep depths of layer and low central tension, thus enabling very thin (i.e., <0.5 mm) sheets of glass to be chemically strengthened while not being susceptible to frangible behavior.

Compressive stress (including surface CS) is measured by surface stress meter (FSM) using commercially available instruments such as the FSM-6000, manufactured by Orihara Industrial Co., Ltd. (Japan). Surface stress measurements rely upon the accurate measurement of the stress optical coefficient (SOC), which is related to the birefringence of the glass. SOC in turn is measured according to Procedure C (Glass Disc Method) described in ASTM standard C770-16, entitled "Standard Test Method for Measurement of Glass Stress-Optical Coefficient," the contents of which are incorporated herein by reference in their entirety.

As used herein, DOL means the depth at which the stress in the chemically strengthened alkali aluminosilicate glass article described herein changes from compressive to tensile. DOL may be measured by FSM or a scattered light polariscope (SCALP) depending on the ion exchange treatment. Where the stress in the glass article is generated by exchanging potassium ions into the glass article, FSM is used to measure DOL. Where the stress is generated by exchanging sodium ions into the glass article, SCALP is used to measure DOL. Where the stress in the glass article is generated by exchanging both potassium and sodium ions into the glass, the DOL is measured by SCALP, since it is believed the exchange depth of $Na^+$ ions ("Potassium DOL") indicates the DOL and the exchange depth of potassium ions indicates a change in the magnitude of the compressive stress (but not the change in stress from compressive to tensile). The depth of penetration of $K^+$ ions ("Potassium DOL") represents the depth of potassium penetration as a result of an ion exchange process. The Potassium DOL is typically less than the DOL for the articles described herein. Potassium DOL is measured using a surface stress meter such as the commercially available FSM-6000 surface stress meter, manufactured by Luceo Co., Ltd. (Tokyo, Japan), which relies on accurate measurement of the stress optical coefficient (SOC), as described above with reference to the CS measurement.

The lithium aluminosilicate glasses described herein may be subjected to an ion exchange process in at least one molten salt bath containing either sodium salts, potassium salts, or both sodium and potassium salts. The nitrate salts $NaNO_3$ and $KNO_3$ are typically used in the ion exchange process. The glasses are held in a salt bath for a time sufficient for ion exchange to occur on the surface and into some depth into the article. In one embodiment, the glass is chemically strengthened by immersion in a molten salt bath comprising $NaNO_3$ for a predetermined time period to achieve a desired level of ion exchange. As a result of the ion exchange, a surface compressive layer is created caused by the substitution of $Li^+$ ions contained in a glass surface layer by $Na^+$ or $K^+$ ions, both of which have a larger ionic radius than $Li^+$. In one embodiment, the temperature of the molten salt bath is about 390° C. and the predetermined time period is in a range from about one to four hours. In other embodiments, ion exchange is carried out in at least one molten salt bath at temperatures ranging from about 370° C. to about 390° C.

In some embodiments, the glasses described herein may undergo ion exchange with monovalent silver cations, thus providing the glass surface with antimicrobial properties. Since the ionic radius of $Ag^+$ is greater than that of either $Li^+$ or $Na^+$, silver ion exchange of these glasses results in a lower loss of compressive stress than observed in ion exchanged glasses that contain only sodium and potassium.

In some embodiments, the lithium aluminosilicate glasses described herein may be ion exchanged to achieve a depth of layer of at least about 70 μm when ion exchanged for periods of less than about 7 hours. In addition, these glasses may be ion exchanged to achieve maximum compressive stresses at the surface of the glass of at least about 500 MPa in a one-step ion exchange process, or at least about 600 MPa in a two-step ion exchange process, with some glasses achieving maximum compressive stresses as high as 840 MPa in a one-step ion exchange and as high as 1000 MPa at the glass surface in a two-step ion exchange process. In some embodiments, a compressive stress of at least 700 MPa, or at least about 800 MPa, or at least about 900 MPa may be achieved using either a one-step or a two-step ion exchange process. In some embodiments, the compressive stress in these ion exchanged glasses may be about 50 MPa or greater at depths of 100 μm or more below the surface.

The lithium aluminosilicate glasses described herein may be ion exchanged to achieve depths of compressive layer of at least about 70 μm; in some embodiment, at least about 100 μm; and in still other embodiment, at least about 150 μm by either one-step or two-step ion exchange processes. The ion exchange time at temperatures ranging 370° C. to about 390° C. needed to achieve these depths of layer by either a one-step or two-step process is less than about 7 hours.

Figure 2:
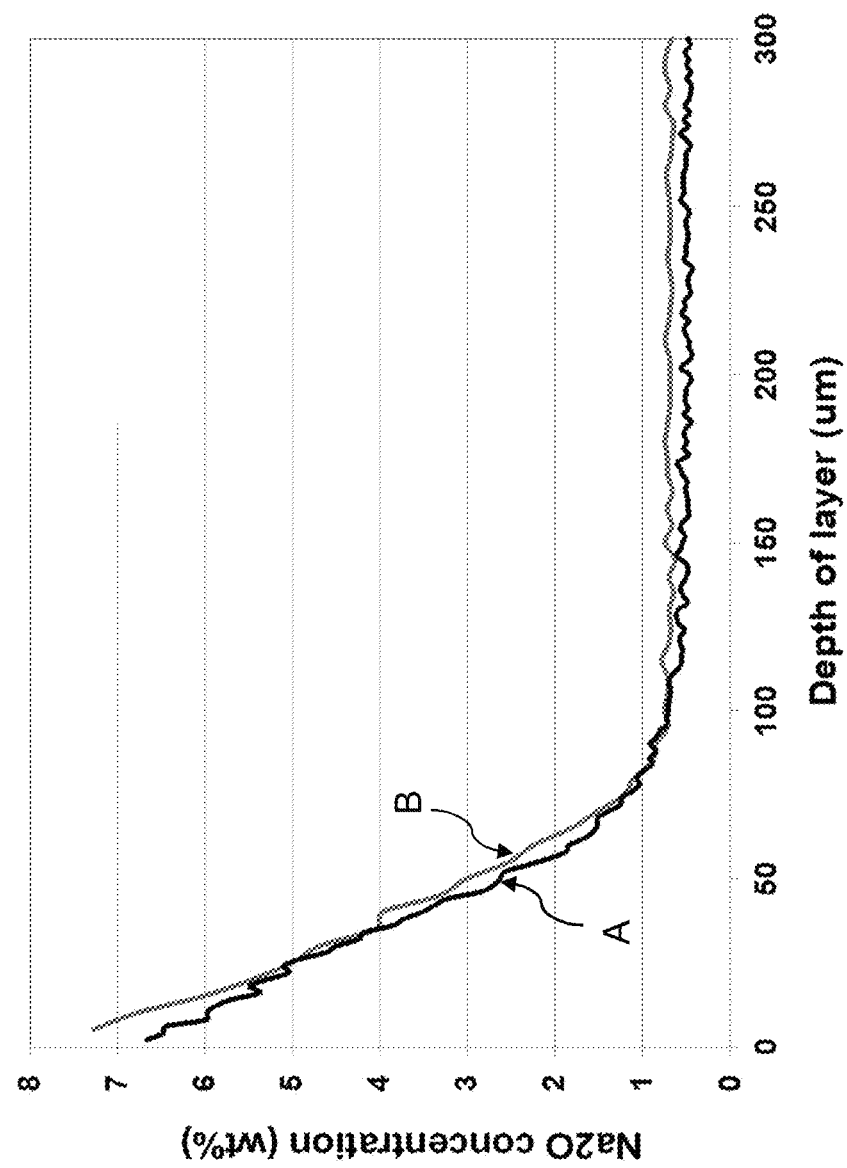
FIG. 2 is a plot of Na$^+$ concentration profile from the surface of the glass to the inner portion of the glass for a lithium aluminosilicate glass of the present disclosure (A) and a glass ceramic (B)

The profile and depth of the compressive layer may be determined from the concentration profile of the larger cations participating in the ion exchange process. The $Na^+$ concentration profile from the surface of the glass to the inner portion of a 1) lithium aluminosilicate glass (example 3 in Table 1) and a glass ceramic (Corning Code 9667; nominal composition listed in Table 1) that had been cerammed at 975° C. for 4 hours) that were ion exchanged at 390° C. for 3.5 hours in a $NaNO_3$ molten salt bath are shown in FIG. 2. In some embodiments, a depth of layer DOL of at least 100 determined from the $Na_2O$ concentration profile, may be achieved for the lithium aluminosilicate glass (1 in FIG. 2).

Table 3 lists conditions for one-step ion exchange, CS, depth of $K^+$ penetration into the glass, and depth of $Na^+$ penetration into the glass for compositions selected from Table 2. Two-step ion exchange conditions, fictive temperature $T_f$, CS, and DOL for compositions selected from Table 2 are listed in Table 4.

TABLE 3

One-step ion exchange conditions, compressive stress (CS), and K⁺ and
Na⁺ penetration for compositions selected from Table 2.

| | 196HLP | 196HLQ | 196HLR | 196HLS | 196HLT | 196HLU |
|---|---|---|---|---|---|---|
| Ion exchange in 100 wt % KNO₃ at 430° C. for 2 hours | | | | | | |
| CS (MPa) | 998 | 861 | 876 | 860 | 905 | 881 |
| K⁺ DOL (μm) | 40 | 25 | 22 | 19 | 14 | 11 |
| Ion exchange in 90 wt % KNO₃/10 wt % NaNO₃ at 390° C. for 3 hours | | | | | | |
| CS (MPa) | 637 | 581 | 683 | 701 | 728 | 667 |
| K⁺ DOL (μm) | 29.6 | 17.5 | 13.6 | 10.1 | 8.2 | 7.5 |
| Na⁺ DOL (μm) | | | 244 | 267 | 237 | 247 |
| Ion exchange in 80 wt % KNO₃/20 wt % NaNO₃ at 390° C. for 3 hours | | | | | | |
| CS (MPa) | 512 | 460 | 606 | 658 | 633 | 651 |
| K⁺ DOL (μm) | 29.0 | 16.3 | 13.5 | 9.8 | 7.3 | 7.9 |
| Na⁺ DOL (μm) | | | 280 | 273 | 237 | 224 |
| Ion exchange in 60 wt % KNO₃/40 wt % NaNO₃ at 390° C. for 3 hours | | | | | | |
| CS (MPa) | 348 | 302 | 505 | 542 | | |
| K⁺ DOL (μm) | 26.9 | 15.7 | 12.6 | 8.7 | | |
| Na⁺ DOL (μm) | | | 244 | 293 | 198 | 195 |
| Ion exchange in 100 wt % NaNO₃ at 370° C. for 0.75 hour | | | | | | |
| CS (MPa) | | | | | | |
| Na⁺ DOL (μm) | | | 198 | 182 | 185 | 192 |

| | 196HQB | 196HQC | 196HQD | 196HQE | 196HQF | 196HQG |
|---|---|---|---|---|---|---|
| Ion exchange in 95 wt % KNO₃/5 wt % NaNO₃ at 390° C. for 3 hours | | | | | | |
| CS (MPa) | 722 | 780 | 822 | 779 | 721 | 651 |
| K⁺ DOL (μm) | 8.3 | 9.8 | 10.7 | 7.9 | 7.1 | 10.4 |
| Na⁺ DOL (μm) | 215 | 221 | 228 | 202 | 215 | 182 |
| Ion exchange in 90 wt % KNO₃/10 wt % NaNO₃ at 390° C. for 3 hours | | | | | | |
| CS (MPa) | 670 | 693 | 741 | 695 | 695 | 582 |
| K⁺ DOL (μm) | 7.8 | 9.9 | 10.1 | 7.4 | 6.9 | 10.9 |
| Na⁺ DOL (μm) | 224 | 228 | 250 | 224 | 234 | 195 |
| Ion exchange in 80 wt % KNO₃/20 wt % NaNO₃ at 390° C. for 3 hours | | | | | | |
| CS (MPa) | 568 | 604 | 639 | 599 | 579 | 486 |
| K⁺ DOL (μm) | 7.6 | 9.8 | 10.0 | 7.5 | 7.1 | 8.9 |
| Na⁺ DOL (μm) | 202 | 241 | 208 | 244 | 231 | 205 |
| Ion exchange in 100 wt % NaNO₃ at 370° C. for 0.75 hour | | | | | | |
| CS (MPa) | | | | | | |
| Na⁺ DOL (μm) | 189 | 192 | 179 | 176 | 182 | 182 |

| | 196HQH | 196HQI | 196HQJ | 196HQK | 196HQL | 196HQM |
|---|---|---|---|---|---|---|
| Ion exchange in 95 wt % KNO₃/5 wt % NaNO₃ at 390° C. for 3 hours | | | | | | |
| CS (MPa) | 713 | 789 | 707 | 848 | 822 | 766 |
| K⁺ DOL (μm) | 11.2 | 7.7 | 9.9 | 10.2 | 8.8 | 7.0 |
| Na⁺ DOL (μm) | 182 | 241 | 202 | 250 | 228 | 224 |
| Ion exchange in 80 wt % KNO₃/20 wt % NaNO₃ at 390° C. for 3 hours | | | | | | |
| CS (MPa) | 539 | 629 | 613 | 652 | 611 | 602 |
| K⁺ DOL (μm) | 10.5 | 5.4 | 5.3 | 9.1 | 8.1 | 7.2 |
| Na⁺ DOL (μm) | 192 | 254 | 202 | 257 | 234 | 195 |
| Ion exchange in 60 wt % KNO₃/40 wt % NaNO₃ at 390° C. for 3 hours | | | | | | |
| CS (MPa) | 455 | 503 | 460 | 528 | 510 | 485 |
| K⁺ DOL (μm) | 9.6 | 7.4 | 8.1 | 8.8 | 8.3 | 7.6 |
| Na⁺ DOL (μm) | 205 | 260 | 185 | 244 | 237 | 205 |
| Ion exchange in 100 wt % NaNO₃ at 370° C. for 0.75 hour | | | | | | |
| CS (MPa) | | | | | | |
| Na⁺ DOL (μm) | 172 | 169 | 169 | 169 | 172 | 172 |

TABLE 4

Two-step ion exchange conditions, fictive temperature $T_f$, CS, and DOL for compositions selected from Table 2.

|  | 196HLR | 196HLS | 196HLT | 196HLU |
|---|---|---|---|---|
| $T_f$ (° C.) | 652 | 638 | 623 | 623 |
| Bath 1 | | | | |
| Temperature (° C.) | 390 | 390 | 390 | 390 |
| Time (hr) | 0.75 | 0.75 | 0.75 | 0.75 |
| Composition (wt %) | 80% KNO$_3$ 20% NaNO$_3$ | 80% KNO$_3$ 20% NaNO$_3$ | 80% KNO$_3$ 20% NaNO$_3$ | 80% KNO$_3$ 20% NaNO$_3$ |
| Bath 2 | | | | |
| Temperature (° C.) | 390 | 390 | 390 | 390 |
| Time (hr) | 0.75 | 0.75 | 0.75 | 0.75 |
| Composition (wt %) | 100% KNO$_3$ | 100% KNO$_3$ | 100% KNO$_3$ | 100% KNO$_3$ |
| CS (MPa) | 1041 | 1068 | 1042 | |
| DOL (μm) | 185 | 195 | 163 | 195 |

Vickers crack initiation thresholds described herein are determined by applying and then removing an indentation load to the glass surface at a rate of 0.2 mm/min. The maximum indentation load is held for 10 seconds. The indentation cracking threshold is defined at the indentation load at which 50% of 10 indents exhibit any number of radial/median cracks emanating from the corners of the indent impression. The maximum load is increased until the threshold is met for a given glass composition. All indentation measurements are performed at room temperature in 50% relative humidity. The test involved the use of a square-based pyramidal diamond indenter with an angle of 136° between faces, referred to as a Vickers indenter. The Vickers indenter was same as the one used in standard micro hardness testing (reference ASTM-E384-11).

As used herein, the term "Knoop Scratch Threshold" refers to the onset of lateral cracking. In Knoop threshold testing, a mechanical tester holds a Knoop diamond in which a glass is scratched at increasing loads to determine the onset of lateral cracking. As used herein, Knoop Scratch Threshold is the onset of lateral cracking (in 3 or more of 5 indentation events). In Knoop Scratch Lateral Cracking Threshold testing, samples of the glass articles and articles were first scratched with a Knoop indenter under a dynamic or ramped load to identify the lateral crack onset load range for the sample population. Once the applicable load range is identified, a series of increasing constant load scratches (3 minimum or more per load) are performed to identify the Knoop scratch threshold. The Knoop scratch threshold range can be determined by comparing the test specimen to one of the following 3 failure modes: 1) sustained lateral surface cracks that are more than two times the width of the groove, 2) damage is contained within the groove, but there are lateral surface cracks that are less than two times the width of groove and there is damage visible by naked eye, or 3) the presence of large subsurface lateral cracks which are greater than two times the width of groove and/or there is a median crack at the vertex of the scratch.

Figure 3:
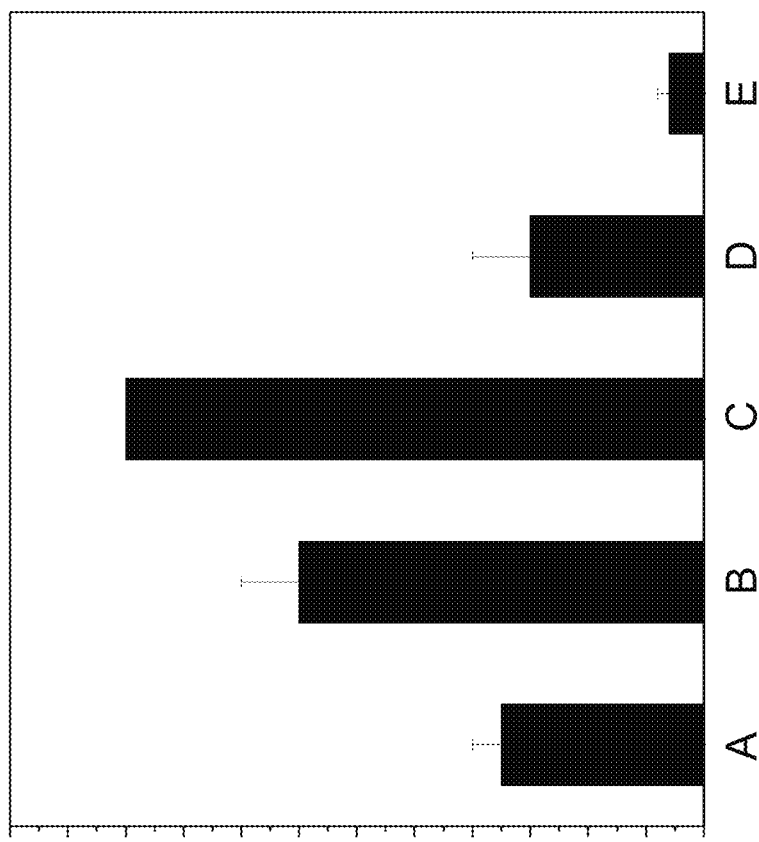
FIG. 3 is a plot of indentation fracture threshold for a lithium aluminosilicate glass of the present disclosure, ion exchanged at 390° C. in NaNO$_3$ for 3.5 hours, and sodium aluminosilicate glasses after ion exchange in KNO$_3$.
Figure 4:
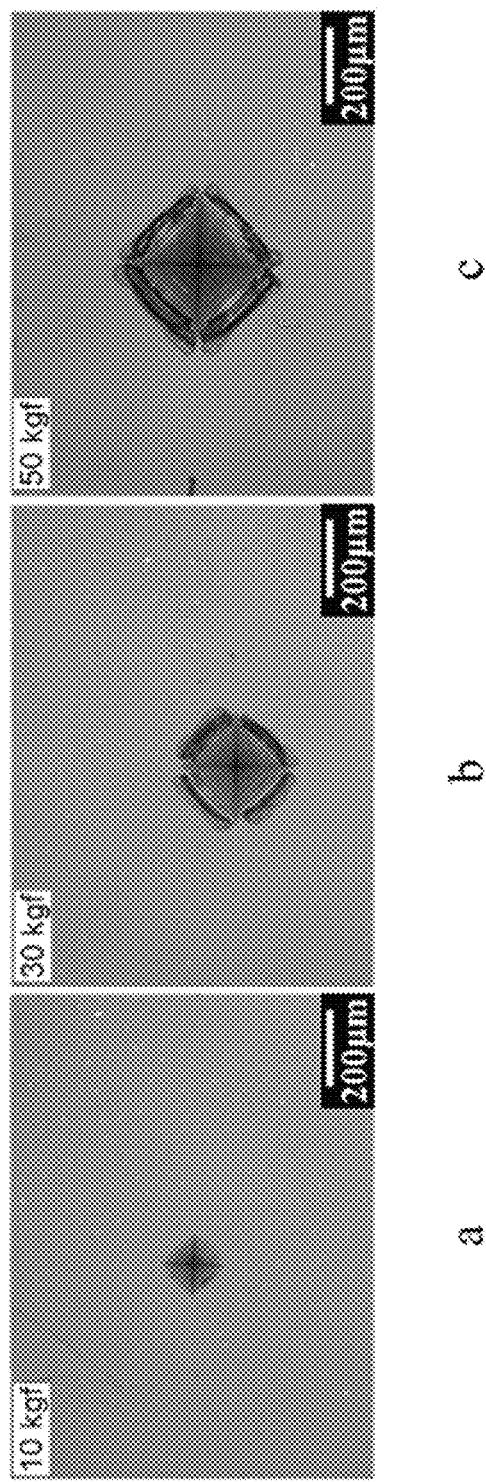
FIG. 4 shows optical microscopic images of Vickers indentations in the ion exchanged lithium aluminosilicate glass plotted in FIG. 3 under indenter loads of 10 kgf, 30 kgf, and 50 kgf.

When ion exchanged in NaNO$_3$, the glasses described herein exhibit high native damage resistance, and, in some embodiments, capable of achieving a Vickers crack initiation threshold of over 50 kilogram force (kgf). This level of damage resistance may be achieved, for example, for the glasses described herein containing 6 mol % Li$_2$O following ion exchange at 390° C. in a NaNO$_3$ bath for 3.5 hours. This Vickers crack initiation threshold value is comparable to—or greater than—those exhibited by analogous sodium aluminosilicate glasses having high levels of inherent damage resistance. FIG. 3 is a plot of indentation fracture thresholds (IFT) determined after ion exchange in KNO$_3$ for the present lithium aluminosilicate glass (example 3 in Table 1, ion exchanged at 390° C. in NaNO$_3$ for 3.5 hours) (C in FIG. 3), and in fusion-formed sodium aluminosilicate glasses A and E (nominal composition: 67.6 mol % SiO$_2$; 3.7 mol % B$_2$O$_3$; 12.7 mol % Al$_2$O$_3$; 13.7 mol % Na$_2$O; 0.01 mol % K$_2$O; 2.3 mol % MgO; and 0.1 mol % SnO$_2$) with IFT of 15-20 kgf; glass B (nominal composition: 64.7 mol % SiO$_2$; 5.1 mol % B$_2$O$_3$; 13.9 mol % Al$_2$O$_3$; 13.7 mol % Na$_2$O; 2.4 mol % MgO; and 0.08 mol % SnO$_2$) with IFT of 30-40 kgf; and glass D (nominal composition: 64.7 mol % SiO$_2$; 5.1 mol % B$_2$O$_3$; 13.9 mol % Al$_2$O$_3$; 13.7 mol % Na$_2$O; 2.4 mol % MgO; and 0.08 mol % SnO$_2$) with IFT of 15 kgf. Optical microscopic images of Vickers indentations in the ion exchanged lithium aluminosilicate glass plotted in FIG. 3 under indenter loads of 10 kgf (a in FIG. 4), 30 kgf (b), and 50 kgf (c) are shown in FIG. 4. The images in FIG. 4 show significant glass densification without formation of lateral cracking, indicating that the glass possesses a high level of inherent damage resistance.

In some embodiments, the glasses described herein, when ion exchanged as detailed above, may exhibit Vickers crack initiation thresholds (VIT) of at least 10 kgf; in some embodiments, at least 15 kgf; and in still other embodiments, at least about 20 kgf. In certain embodiments, the Vickers crack initiation threshold is in a range from about 10 kgf to about 35 kgf and Knoop scratch thresholds (KST) are in a range from about 10 Newtons (N) to about 20 N.

Vickers crack initiation thresholds (VIT) and Knoop scratch thresholds (KST) for glasses that were ion exchanged in one-step and two-step ion exchange processes are listed in Tables 3 and 4, respectively.

Figure 5A:
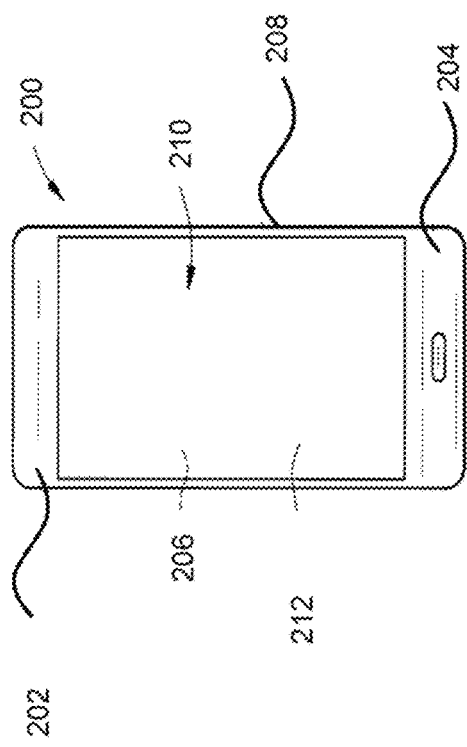
FIG. 5A is a plan view of an exemplary electronic device incorporating any of the articles disclosed herein.
Figure 5B:
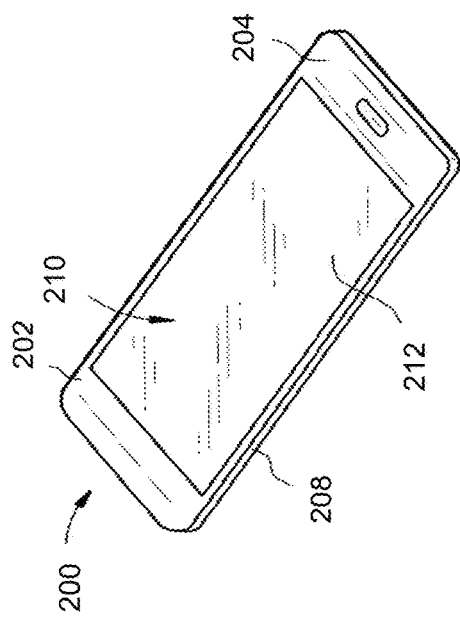
FIG. 5B is a perspective view of the exemplary electronic device of FIG. 5A.

The articles disclosed herein may be incorporated into another article such as an article with a display (or display articles) (e.g., consumer electronics, including mobile phones, tablets, computers, navigation systems, and the like), architectural articles, transportation articles (e.g., automotive, trains, aircraft, sea craft, etc.), appliance articles, or any article that requires some transparency, scratch-resistance, abrasion resistance or a combination thereof. An exemplary article incorporating any of the strengthened articles disclosed herein is shown in FIGS. 5A and 5B. Specifically, FIGS. 5A and 5B show a consumer electronic device 200 including a housing 202 having front 204, back 206, and side surfaces 208; electrical components (not shown) that are at least partially inside or entirely within the housing and including at least a controller, a memory, and a display 210 at or adjacent to the front surface of the housing; and a cover substrate 212 at or over the front surface of the housing such that it is over the display. In some embodiments, the cover substrate 212 and/or housing may include any of the strengthened articles disclosed herein.

While typical embodiments have been set forth for the purpose of illustration, the foregoing description should not be deemed to be a limitation on the scope of the disclosure or appended claims. Accordingly, various modifications, adaptations, and alternatives may occur to one skilled in the art without departing from the spirit and scope of the present disclosure and appended claims.

The invention claimed is:

1. A lithium aluminosilicate glass article, wherein the lithium aluminosilicate glass article is formed from a glass comprising:

from 55 mol % to 75 mol % $SiO_2$;
from 9 mol % to 18 mol % $Al_2O_3$;
from 2.5 mol % to 20 mol % $B_2O_3$; and
from 3 mol % to 20 mol % $Li_2O$,
wherein the lithium aluminosilicate glass article is ion exchanged and has a compressive layer extending to a depth of layer of at least 70 μm from at least one surface into the glass article, the compressive layer having a maximum compressive stress of at least 600 MPa, wherein the glass article has a Vickers crack initiation threshold of at least 10 kgf and a Knoop scratch threshold of at least 8 N.

2. The lithium aluminosilicate glass article of claim 1, the glass from which the lithium aluminosilicate glass article is formed comprises:
from 10 mol % to about 18 mol % $Al_2O_3$;
from 3.5 mol % to about 9.5 mol % $B_2O_3$;
from 7 mol % to 12.6 mol % $Li_2O$; and
from 0 mol % to 4 mol % $P_2O_5$,
wherein $Li_2O$(mol %)/$R_2O$(mol %) is in a range from about 0.22 to 0.4 and $R_2O=Li_2O+Na_2O+K_2O+Rb_2O+Cs_2O$.

3. The lithium aluminosilicate glass article of claim 1, the glass from which the lithium aluminosilicate glass article is formed comprises:
from 10 mol % to 18 mol % $Al_2O_3$;
from 2.5 mol % to 7.5 mol % $B_2O_3$;
from 5 mol % to 12.6 mol % $Li_2O$;
from 0 mol % to 4 mol % $P_2O_5$; and
from 0 mol % to 1 mol % $K_2O$;
wherein $Li_2O$(mol %)/$R_2O$(mol %) is in a range from 0.22 to 0.4, $R_2O=Li_2O+Na_2O+K_2O+Rb_2O+Cs_2O$, $R_2O$(mol %)+R'O(mol %) −$Al_2O_3$(mol %)−$B_2O_3$(mol %)−$P_2O_5$(mol %) is in a range from −10.5 mol % to −0.11 mol %, and R'O=MgO+CaO+SrO+BaO.

4. The lithium aluminosilicate glass article of claim 1, wherein the lithium aluminosilicate glass comprises from 5 mol % to about 7 mol % $B_2O_3$.

5. The lithium aluminosilicate glass article of claim 1, wherein the glass from which the lithium aluminosilicate glass article is formed comprises:
from 0 mol % to 5 mol % $Na_2O$; and
from 0.05 mol % to 0.5 mol % $SnO_2$.

6. The lithium aluminosilicate glass article of claim 1, wherein the glass from which the lithium aluminosilicate glass article is formed is characterized by $R_2O$(mol %)−$Al_2O_3$(mol %) is in a range from 0.5 mol % to 5.6 mol %.

7. The lithium aluminosilicate glass article of claim 1, wherein the glass from which the lithium aluminosilicate glass article is formed is characterized by ($Al_2O_3$(mol %)+$B_2O_3$(mol %))/$R_2O$(mol %) is in a range from 0.9 to 1.57.

8. The lithium aluminosilicate glass article of claim 1, wherein the glass from which the lithium aluminosilicate glass article is formed is characterized by $R_2O$(mol %)+R'O (mol %)−$Al_2O_3$(mol %)−$B_2O_3$(mol %)−$P_2O_5$(mol %) is in a range from −10.0 mol % to −0.11 mol %, where R'O=MgO+CaO+SrO+BaO.

9. The lithium aluminosilicate glass article of claim 1, wherein $Al_2O_3$(mol %)>$B_2O_3$(mol %).

10. The lithium aluminosilicate glass article of claim 1, wherein the glass from which the lithium aluminosilicate glass article is formed has a liquidus viscosity of at least 10 kP.

11. The lithium aluminosilicate glass article of claim 1, wherein the lithium aluminosilicate glass has a softening point of 840° C. or less.

12. The lithium aluminosilicate glass article of claim 1, wherein the glass from which the lithium aluminosilicate glass article is formed has an anneal point of at least 510° C.

13. The lithium aluminosilicate glass article of claim 1, wherein the glass from which the lithium aluminosilicate glass article is formed has an elastic modulus of at least 68 GPa.

14. The lithium aluminosilicate glass article of claim 1, wherein the compressive layer has a compressive stress of at least 100 MPa at a depth of 50μm below the surface.

15. A consumer electronic product, comprising:
a housing having a front surface, a back surface and side surfaces;
electrical components provided at least partially within the housing, the electrical components including at least a controller, a memory, and a display, the display being provided at or adjacent the front surface of the housing; and
a cover glass disposed over the display,
wherein at least one of a portion of the housing or the cover glass comprises the lithium aluminosilicate glass article of claim 1.

* * * * *